(12) United States Patent
Chan et al.

(10) Patent No.: US 11,517,938 B2
(45) Date of Patent: Dec. 6, 2022

(54) REFLECTION MINIMIZATION FOR SENSOR

(71) Applicant: InvenSense, Inc., San Jose, CA (US)

(72) Inventors: Mei-Lin Chan, Milpitas, CA (US);
Nikhil Apte, Palo Alto, CA (US);
Renata Melamud Berger, Palo Alto, CA (US)

(73) Assignee: InvenSense, Inc., San Jose, CA (US)

( * ) Notice: Subject to any disclaimer, the term of this patent is extended or adjusted under 35 U.S.C. 154(b) by 1119 days.

(21) Appl. No.: 16/107,894

(22) Filed: Aug. 21, 2018

(65) Prior Publication Data

US 2020/0061670 A1 Feb. 27, 2020

(51) Int. Cl.
| | | |
|---|---|---|
| *B06B 1/06* | (2006.01) | |
| *G10K 11/00* | (2006.01) | |
| *G10K 11/28* | (2006.01) | |
| *G01H 11/08* | (2006.01) | |
| *H01L 41/09* | (2006.01) | |
| *B06B 1/02* | (2006.01) | |
| *H01L 41/047* | (2006.01) | |

(52) U.S. Cl.
CPC .......... *B06B 1/0622* (2013.01); *B06B 1/0292* (2013.01); *B06B 1/0681* (2013.01); *G01H 11/08* (2013.01); *G10K 11/002* (2013.01); *G10K 11/28* (2013.01); *H01L 41/047* (2013.01); *H01L 41/0973* (2013.01)

(58) Field of Classification Search
CPC ............................. B06B 1/0622; B06B 1/0681
USPC .................................................. 310/322, 334
See application file for complete search history.

(56) References Cited

U.S. PATENT DOCUMENTS

| | | | |
|---|---|---|---|
| 7,442,570 B2 | 10/2008 | Nasiri et al. | |
| 2007/0040477 A1* | 2/2007 | Sugiura | G01S 7/521 310/324 |
| 2011/0152691 A1* | 6/2011 | Ikeda | G10K 11/002 600/459 |
| 2015/0273526 A1* | 10/2015 | Tsuruno | B06B 1/0666 600/443 |

\* cited by examiner

*Primary Examiner* — Derek J Rosenau

(57) ABSTRACT

An electronic device includes a substrate layer having a front surface and a back surface opposite the front surface, a plurality of ultrasonic transducers formed on the front surface of the substrate layer, wherein the plurality of ultrasonic transducers generate backward waves during operation, the backward waves propagating through the substrate layer, and a plurality of substrate structures formed within the back surface of the substrate layer, the plurality of substrate structures configured to modify the backward waves during the operation.

24 Claims, 15 Drawing Sheets

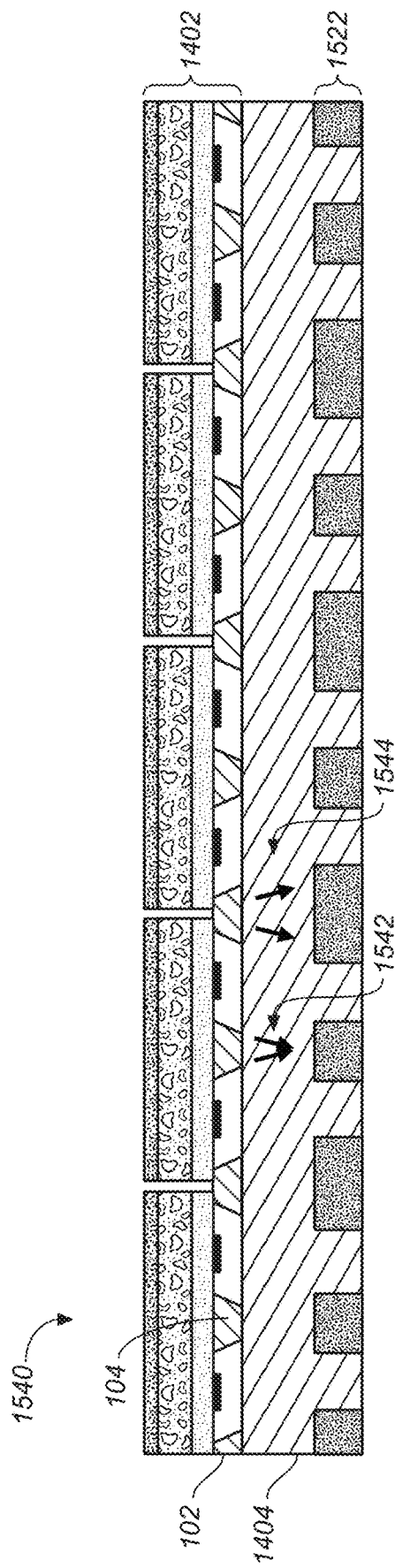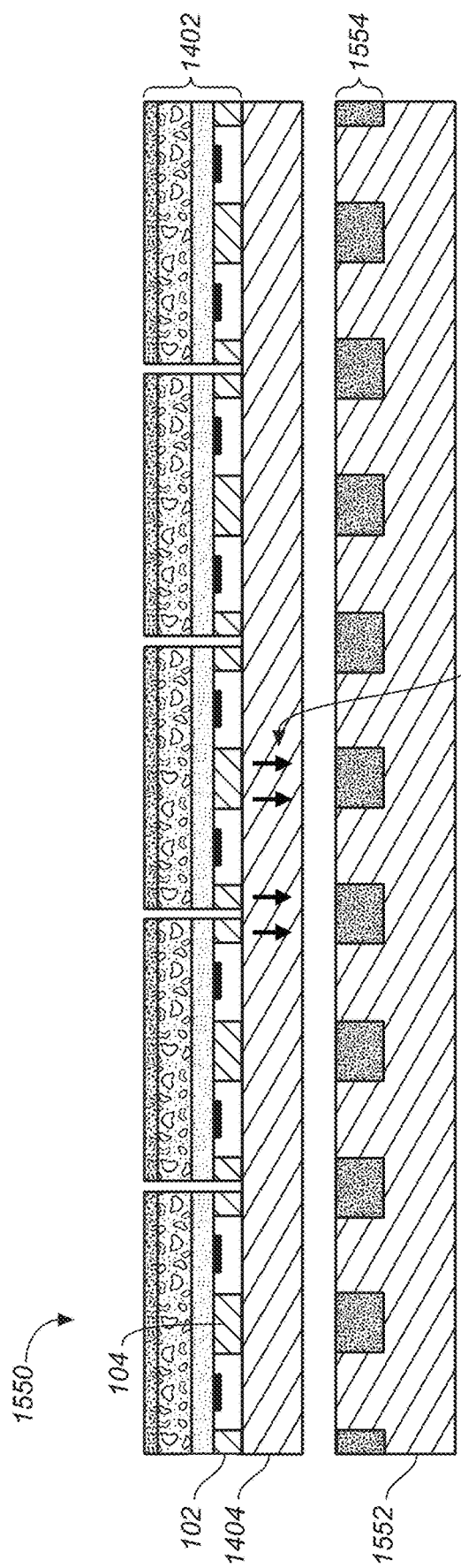
FIG. 15D
FIG. 15E

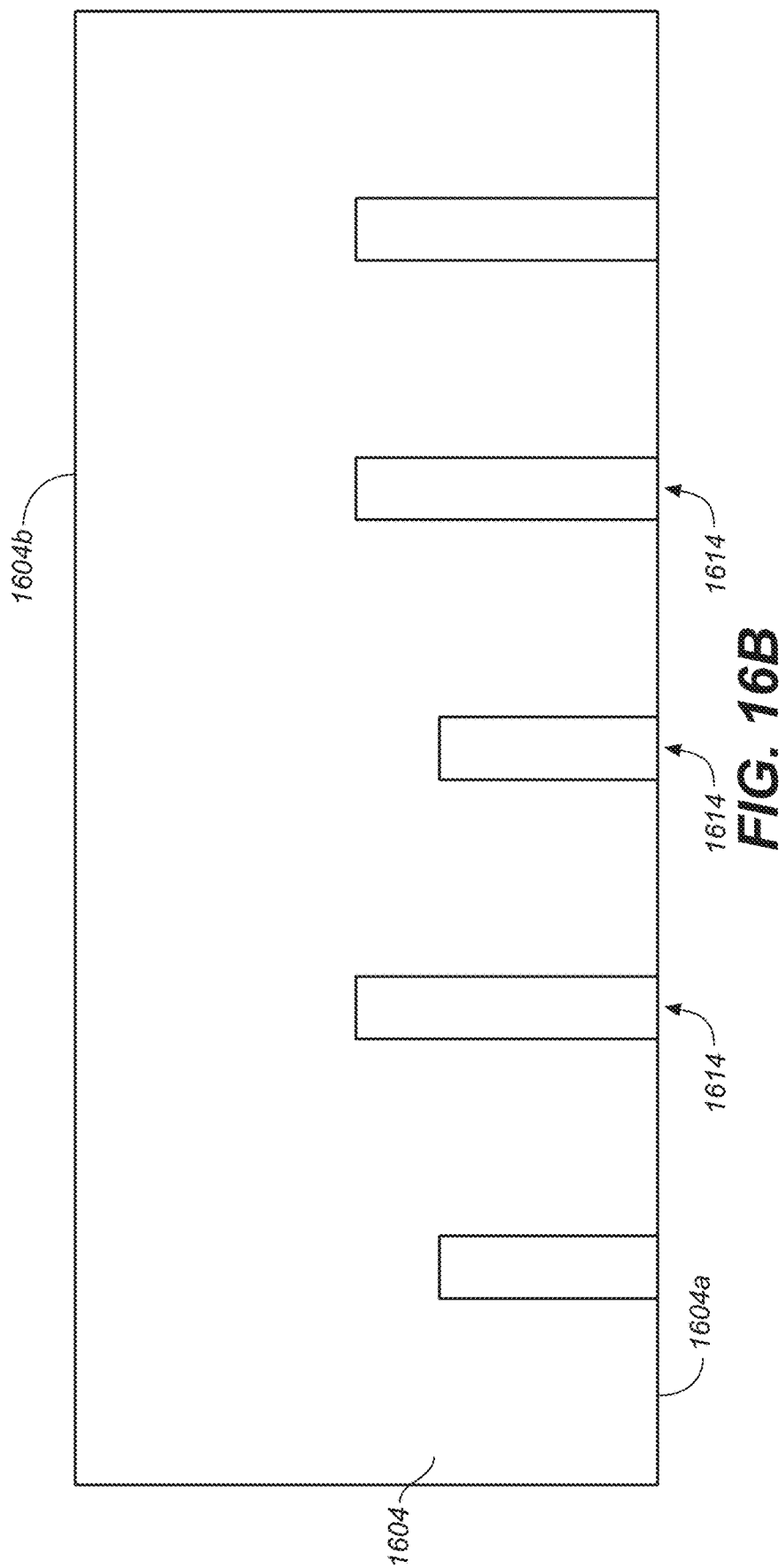

REFLECTION MINIMIZATION FOR SENSOR

BACKGROUND

Piezoelectric materials facilitate conversion between mechanical energy and electrical energy. Moreover, a piezoelectric material can generate an electrical signal when subjected to mechanical stress, and can vibrate when subjected to an electrical voltage. Piezoelectric materials are widely utilized in piezoelectric ultrasonic transducers to generate acoustic waves based on an actuation voltage applied to electrodes of the piezoelectric ultrasonic transducer.

BRIEF DESCRIPTION OF THE DRAWINGS

The accompanying drawings, which are incorporated in and form a part of the Description of Embodiments, illustrate various embodiments of the subject matter and, together with the Description of Embodiments, serve to explain principles of the subject matter discussed below. Unless specifically noted, the drawings referred to in this Brief Description of Drawings should be understood as not being drawn to scale. Herein, like items are labeled with like item numbers.

FIGS. 15A through 15G illustrate various examples of electronic devices including features for reducing a contribution from reflected backward waves during operation, in accordance with various embodiments.

FIGS. 16A through 16D illustrate various examples of patterned backsides of a substrate layer, according to embodiments.

DESCRIPTION OF EMBODIMENTS

Figure 1A:
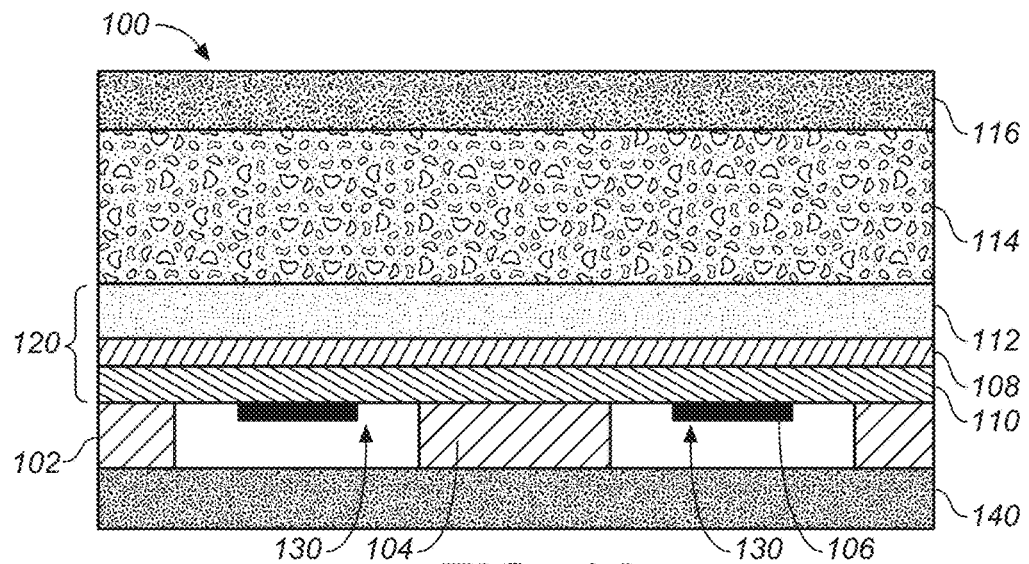
FIG. 1A is a diagram illustrating a piezoelectric micromachined ultrasonic transducer (PMUT) device having a center pinned membrane, according to some embodiments.

The following Description of Embodiments is merely provided by way of example and not of limitation. Furthermore, there is no intention to be bound by any expressed or implied theory presented in the preceding background or in the following Description of Embodiments.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Notation and Nomenclature

Some portions of the detailed descriptions which follow are presented in terms of procedures, logic blocks, processing and other symbolic representations of operations on data within an electrical device. These descriptions and representations are the means used by those skilled in the data processing arts to most effectively convey the substance of their work to others skilled in the art. In the present application, a procedure, logic block, process, or the like, is conceived to be one or more self-consistent procedures or instructions leading to a desired result. The procedures are those requiring physical manipulations of physical quantities. Usually, although not necessarily, these quantities take the form of acoustic (e.g., ultrasonic) signals capable of being transmitted and received by an electronic device and/or electrical or magnetic signals capable of being stored, transferred, combined, compared, and otherwise manipulated in an electrical device.

It should be borne in mind, however, that all of these and similar terms are to be associated with the appropriate physical quantities and are merely convenient labels applied to these quantities. Unless specifically stated otherwise as apparent from the following discussions, it is appreciated that throughout the description of embodiments, discussions utilizing terms such as "transmitting," "receiving," "sensing," "generating," "imaging," "forming," or the like, refer to the actions and processes of an electronic device such as an electrical device.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, logic, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example systems described herein may include components other than those shown, including well-known components.

Various techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, perform one or more of the methods described herein. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

Various embodiments described herein may be executed by one or more processors, such as one or more motion processing units (MPUs), sensor processing units (SPUs), host processor(s) or core(s) thereof, digital signal processors (DSPs), general purpose microprocessors, application specific integrated circuits (ASICs), application specific instruction set processors (ASIPs), field programmable gate arrays (FPGAs), a programmable logic controller (PLC), a complex programmable logic device (CPLD), a discrete gate or transistor logic, discrete hardware components, or any combination thereof designed to perform the functions described herein, or other equivalent integrated or discrete logic circuitry. The term "processor," as used herein may refer to any of the foregoing structures or any other structure suitable for implementation of the techniques described herein. As is employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Moreover, processors can exploit nano-scale architectures such as, but not limited to, molecular and quantum-dot based transistors, switches and gates, in order to optimize space usage or enhance performance of user equipment. A processor may also be implemented as a combination of computing processing units.

In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an SPU/MPU and a microprocessor, a plurality of microprocessors, one or more microprocessors in conjunction with an SPU core, MPU core, or any other such configuration.

Overview of Discussion

Discussion begins with a description of an example Piezoelectric Micromachined Ultrasonic Transducer (PMUT), in accordance with various embodiments. Example arrays including PMUT devices are then described. Example operations of the example arrays of PMUT devices are then further described.

A conventional piezoelectric ultrasonic transducer able to generate and detect pressure waves can include a membrane with the piezoelectric material, a supporting layer, and electrodes combined with a cavity beneath the electrodes. Miniaturized versions are referred to as PMUTs. Typical PMUTs use an edge anchored membrane or diaphragm that maximally oscillates at or near the center of the membrane at a resonant frequency (f) proportional to $h/a^2$, where h is the thickness, and a is the radius of the membrane. Higher frequency membrane oscillations can be created by increasing the membrane thickness, decreasing the membrane radius, or both. Increasing the membrane thickness has its limits, as the increased thickness limits the displacement of the membrane. Reducing the PMUT membrane radius also has limits, because a larger percentage of PMUT membrane area is used for edge anchoring.

Embodiments described herein relate to a PMUT device for ultrasonic wave generation and sensing. In accordance with various embodiments, an array of such PMUT devices is described. The PMUT includes a substrate and an edge support structure connected to the substrate. A membrane is connected to the edge support structure such that a cavity is defined between the membrane and the substrate, where the membrane is configured to allow movement at ultrasonic frequencies. The membrane includes a piezoelectric layer and first and second electrodes coupled to opposing sides of the piezoelectric layer. An interior support structure is disposed within the cavity and connected to the substrate and the membrane. In some embodiments, the interior support structure may be omitted.

The described PMUT device and array of PMUT devices can be used for generation of acoustic signals or measurement of acoustically sensed data in various applications, such as, but not limited to, medical applications, security systems, biometric systems (e.g., fingerprint sensors and/or motion/gesture recognition sensors), mobile communication systems, industrial automation systems, consumer electronic devices, robotics, etc. In one embodiment, the PMUT device can facilitate ultrasonic signal generation and sensing (transducer). Moreover, embodiments describe herein provide a sensing component including a silicon wafer having a two-dimensional (or one-dimensional) array of ultrasonic transducers.

Embodiments described herein provide a PMUT that operates at a high frequency for reduced acoustic diffraction through high acoustic velocity materials (e.g., glass, metal), and for shorter pulses so that spurious reflections can be time-gated out. Embodiments described herein also provide a PMUT that has a low quality factor providing a shorter ring-up and ring-down time to allow better rejection of spurious reflections by time-gating. Embodiments described herein also provide a PMUT that has a high fill-factor providing for large transmit and receive signals.

Piezoelectric Micromachined Ultrasonic Transducer (PMUT)

Systems and methods disclosed herein, in one or more aspects provide efficient structures for an acoustic transducer (e.g., a piezoelectric actuated transducer or PMUT). One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details. In other instances, well-known structures and devices are shown in block diagram form in order to facilitate describing the embodiments in additional detail.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the word "example" is used herein to mean serving as an example, instance, or illustration.

FIG. 1A is a diagram illustrating a PMUT device 100 having a center pinned membrane, according to some embodiments. PMUT device 100 includes an interior pinned membrane 120 positioned over a substrate 140 to define a cavity 130. In one embodiment, membrane 120 is attached both to a surrounding edge support 102 and interior support 104. In one embodiment, edge support 102 is connected to an electric potential. Edge support 102 and interior support 104 may be made of electrically conducting materials, such as and without limitation, aluminum, molybdenum, or titanium. Edge support 102 and interior support 104 may also be made of dielectric materials, such as silicon dioxide, silicon nitride or aluminum oxide that have electrical connections the sides or in vias through edge support 102 or interior support 104, electrically coupling lower electrode 106 to electrical wiring in substrate 140.

In one embodiment, both edge support 102 and interior support 104 are attached to a substrate 140. In various embodiments, substrate 140 may include at least one of, and without limitation, silicon or silicon nitride. It should be appreciated that substrate 140 may include electrical wirings and connection, such as aluminum or copper. In one embodiment, substrate 140 includes a CMOS logic wafer bonded to edge support 102 and interior support 104. In one embodiment, the membrane 120 comprises multiple layers. In an example embodiment, the membrane 120 includes lower electrode 106, piezoelectric layer 110, and upper electrode 108, where lower electrode 106 and upper electrode 108 are coupled to opposing sides of piezoelectric layer 110. As shown, lower electrode 106 is coupled to a lower surface of piezoelectric layer 110 and upper electrode 108 is coupled to an upper surface of piezoelectric layer 110. It should be appreciated that, in various embodiments, PMUT device 100 is a microelectromechanical (MEMS) device.

In one embodiment, membrane 120 also includes a mechanical support layer 112 (e.g., stiffening layer) to mechanically stiffen the layers. In various embodiments, mechanical support layer 112 may include at least one of, and without limitation, silicon, silicon oxide, silicon nitride, aluminum, molybdenum, titanium, etc. In one embodiment, PMUT device 100 also includes an acoustic coupling layer 114 above membrane 120 for supporting transmission of acoustic signals. It should be appreciated that acoustic coupling layer can include air, liquid, gel-like materials, or other materials for supporting transmission of acoustic signals. In one embodiment, PMUT device 100 also includes platen layer 116 above acoustic coupling layer 114 for containing acoustic coupling layer 114 and providing a contact surface for a finger or other sensed object with PMUT device 100. It should be appreciated that, in various embodiments, acoustic coupling layer 114 provides a contact surface, such that platen layer 116 is optional. Moreover, it should be appreciated that acoustic coupling layer 114 and/or platen layer 116 may be included with or used in conjunction with multiple PMUT devices. For example, an array of PMUT devices may be coupled with a single acoustic coupling layer 114 and/or platen layer 116.

Figure 1B:
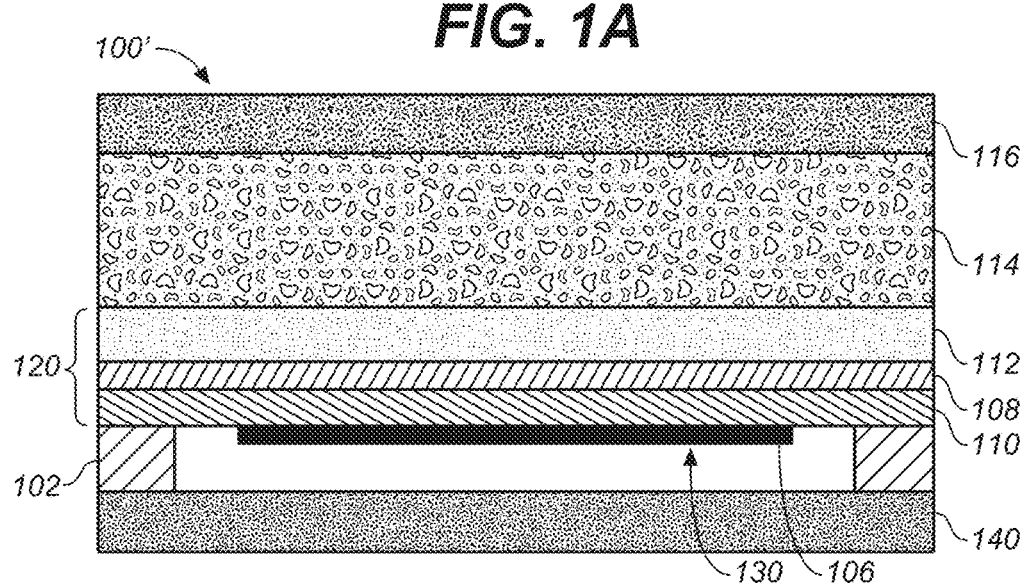
FIG. 1B is a diagram illustrating a PMUT device having an unpinned membrane, according to some embodiments.

FIG. 1B is identical to FIG. 1A in every way, except that the PMUT device 100' of FIG. 1B omits the interior support 104 and thus membrane 120 is not pinned (e.g., is "unpinned"). There may be instances in which an unpinned membrane 120 is desired. However, in other instances, a pinned membrane 120 may be employed.

Figure 2:
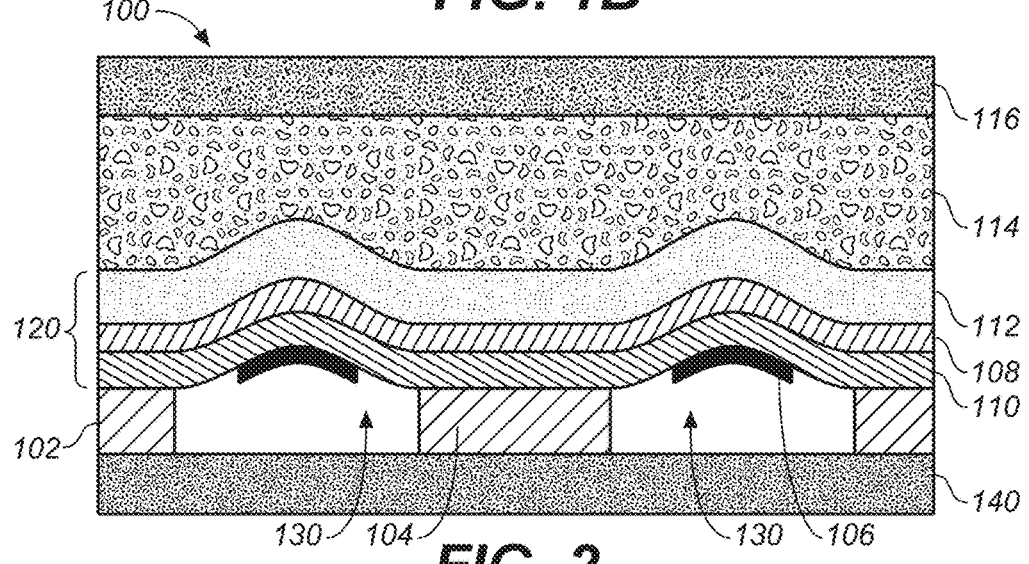
FIG. 2 is a diagram illustrating an example of membrane movement during activation of a PMUT device having a center pinned membrane, according to some embodiments.

FIG. 2 is a diagram illustrating an example of membrane movement during activation of pinned PMUT device 100, according to some embodiments. As illustrated with respect to FIG. 2, in operation, responsive to an object proximate platen layer 116, the electrodes 106 and 108 deliver a high frequency electric charge to the piezoelectric layer 110, causing those portions of the membrane 120 not pinned to the surrounding edge support 102 or interior support 104 to be displaced upward into the acoustic coupling layer 114. This generates a pressure wave that can be used for signal probing of the object. Return echoes can be detected as pressure waves causing movement of the membrane, with compression of the piezoelectric material in the membrane causing an electrical signal proportional to amplitude of the pressure wave.

The described PMUT device 100 can be used with almost any electrical device that converts a pressure wave into mechanical vibrations and/or electrical signals. In one aspect, the PMUT device 100 can comprise an acoustic sensing element (e.g., a piezoelectric element) that generates and senses ultrasonic sound waves. An object in a path of the generated sound waves can create a disturbance (e.g., changes in frequency or phase, reflection signal, echoes, etc.) that can then be sensed. The interference can be analyzed to determine physical parameters such as (but not limited to) distance, density and/or speed of the object. As an example, the PMUT device 100 can be utilized in various applications, such as, but not limited to, fingerprint or physiologic sensors suitable for wireless devices, industrial systems, automotive systems, robotics, telecommunications, security, medical devices, etc. For example, the PMUT device 100 can be part of a sensor array comprising a plurality of ultrasonic transducers deposited on a wafer, along with various logic, control and communication electronics. A sensor array may comprise homogenous or identical PMUT devices 100, or a number of different or heterogonous device structures.

In various embodiments, the PMUT device 100 employs a piezoelectric layer 110, comprised of materials such as, but not limited to, aluminum nitride (AlN), lead zirconate titanate (PZT), quartz, polyvinylidene fluoride (PVDF), and/or zinc oxide, to facilitate both acoustic signal production and sensing. The piezoelectric layer 110 can generate electric charges under mechanical stress and conversely experience a mechanical strain in the presence of an electric field. For example, the piezoelectric layer 110 can sense mechanical vibrations caused by an ultrasonic signal and produce an electrical charge at the frequency (e.g., ultrasonic frequency) of the vibrations. Additionally, the piezoelectric layer 110 can generate an ultrasonic wave by vibrating in an oscillatory fashion that might be at the same frequency (e.g., ultrasonic frequency) as an input current generated by an alternating current (AC) voltage applied across the piezoelectric layer 110. It should be appreciated that the piezoelectric layer 110 can include almost any material (or combination of materials) that exhibits piezoelectric properties, such that the structure of the material does not have a center of symmetry and a tensile or compressive stress applied to the material alters the separation between positive and negative charge sites in a cell causing a polarization at the surface of the material. The polarization is directly proportional to the applied stress and is direction dependent so that compressive and tensile stresses results in electric fields of opposite polarizations.

Figure 10:
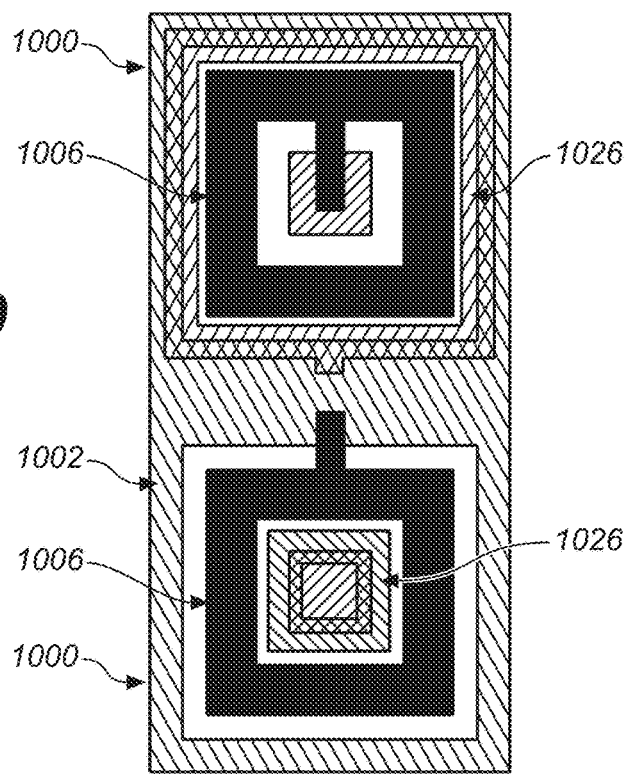
FIG. 10 illustrates an example pair of PMUT devices in a PMUT array, with each PMUT having differing electrode patterning, according to some embodiments.

Further, the PMUT device 100 comprises electrodes 106 and 108 that supply and/or collect the electrical charge to/from the piezoelectric layer 110. It should be appreciated that electrodes 106 and 108 can be continuous and/or patterned electrodes (e.g., in a continuous layer and/or a patterned layer). For example, as illustrated, electrode 106 is a patterned electrode and electrode 108 is a continuous electrode. As an example, electrodes 106 and 108 can be comprised of almost any metal layers, such as, but not limited to, aluminum (Al)/titanium (Ti), molybdenum (Mo), etc., which are coupled with an on opposing sides of the piezoelectric layer 110. In one embodiment, PMUT device also includes a third electrode, as illustrated in FIG. 10 and described below.

According to an embodiment, the acoustic impedance of acoustic coupling layer 114 is selected to be similar to the acoustic impedance of the platen layer 116, such that the acoustic wave is efficiently propagated to/from the membrane 120 through acoustic coupling layer 114 and platen layer 116. As an example, the platen layer 116 can comprise various materials having an acoustic impedance in the range between 0.8 to 4 Mega Rayleigh (MRayl), such as, but not limited to, plastic, resin, rubber, Teflon, epoxy, etc. In another example, the platen layer 116 can comprise various materials having a high acoustic impedance (e.g., an acoustic impendence greater than 10 MRayl), such as, but not limited to, glass, aluminum-based alloys, sapphire, etc. Typically, the platen layer 116 can be selected based on an application of the sensor. For instance, in fingerprinting applications, platen layer 116 can have an acoustic impedance that matches (e.g., exactly or approximately) the acoustic impedance of human skin (e.g., $1.6 \times 10^6$ Rayl). Further, in one aspect, the platen layer 116 can further include a thin layer of anti-scratch material. In various embodiments, the anti-scratch layer of the platen layer 116 is less than the wavelength of the acoustic wave that is to be generated and/or sensed to provide minimum interference during propagation of the acoustic wave. As an example, the anti-scratch layer can comprise various hard and scratch-resistant materials (e.g., having a Mohs hardness of over 7 on the Mohs scale), such as, but not limited to sapphire, glass, titanium nitride (TiN), silicon carbide (SiC), diamond, etc. As an example, PMUT device 100 can operate at 20 MHz and accordingly, the wavelength of the acoustic wave propagating through the acoustic coupling layer 114 and platen layer 116 can be 70-150 microns. In this example scenario, insertion loss can be reduced and acoustic wave propagation efficiency can be improved by utilizing an anti-scratch layer having a thickness of 1 micron and the platen layer 116 as a whole having a thickness of 1-2 millimeters. It is noted that the term "anti-scratch material" as used herein relates to a material that is resistant to scratches and/or scratch-proof and provides substantial protection against scratch marks.

In accordance with various embodiments, the PMUT device 100 can include metal layers (e.g., aluminum (Al)/titanium (Ti), molybdenum (Mo), etc.) patterned to form electrode 106 in particular shapes (e.g., ring, circle, square, octagon, hexagon, etc.) that are defined in-plane with the membrane 120. Electrodes can be placed at a maximum strain area of the membrane 120 or placed at close to either or both the surrounding edge support 102 and interior support 104. Furthermore, in one example, electrode 108 can be formed as a continuous layer providing a ground plane in contact with mechanical support layer 112, which can be formed from silicon or other suitable mechanical stiffening material. In still other embodiments, the electrode 106 can be routed along the interior support 104, advantageously reducing parasitic capacitance as compared to routing along the edge support 102.

For example, when actuation voltage is applied to the electrodes, the membrane 120 will deform and move out of plane. The motion then pushes the acoustic coupling layer 114 it is in contact with and an acoustic (ultrasonic) wave is generated. Oftentimes, vacuum is present inside the cavity 130 and therefore damping contributed from the media within the cavity 130 can be ignored. However, the acoustic coupling layer 114 on the other side of the membrane 120 can substantially change the damping of the PMUT device 100. For example, a quality factor greater than 20 can be observed when the PMUT device 100 is operating in air with atmosphere pressure (e.g., acoustic coupling layer 114 is air) and can decrease lower than 2 if the PMUT device 100 is operating in water (e.g., acoustic coupling layer 114 is water).

Figure 3:
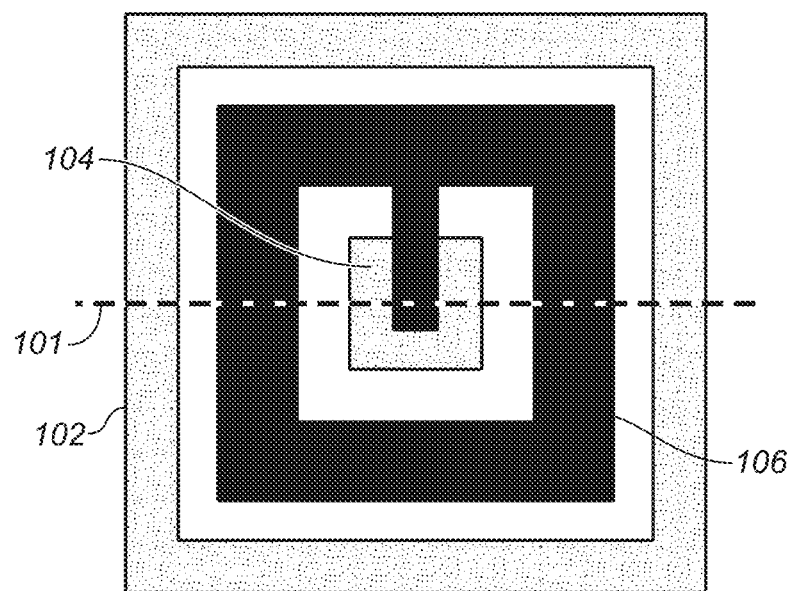
FIG. 3 is a top view of the PMUT device of FIG. 1A, according to some embodiments.

FIG. 3 is a top view of the PMUT device 100 of FIG. 1A having a substantially square shape, which corresponds in part to a cross section along dotted line 101 in FIG. 3. Layout of surrounding edge support 102, interior support 104, and lower electrode 106 are illustrated, with other continuous layers not shown. It should be appreciated that the term "substantially" in "substantially square shape" is intended to convey that a PMUT device 100 is generally square-shaped, with allowances for variations due to manufacturing processes and tolerances, and that slight deviation from a square shape (e.g., rounded corners, slightly wavering lines, deviations from perfectly orthogonal corners or intersections, etc.) may be present in a manufactured device. While a generally square arrangement PMUT device is shown, alternative embodiments including rectangular, hexagon, octagonal, circular, or elliptical are contemplated. In other embodiments, more complex electrode or PMUT device shapes can be used, including irregular and non-symmetric layouts such as chevrons or pentagons for edge support and electrodes.

Figure 4:
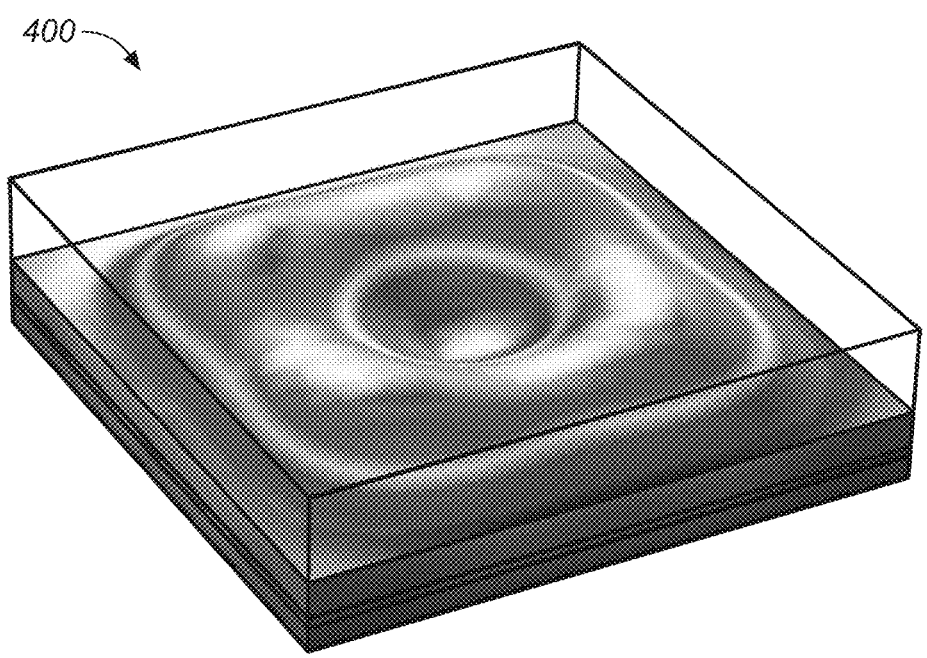
FIG. 4 is a simulated map illustrating maximum vertical displacement of the membrane of the PMUT device shown in FIGS. 1A, 2, and 3, according to some embodiments.

FIG. 4 is a simulated topographic map 400 illustrating maximum vertical displacement of the membrane 120 of the PMUT device 100 shown in FIGS. 1A-3. As indicated, maximum displacement generally occurs along a center axis of the lower electrode, with corner regions having the greatest displacement. As with the other figures, FIG. 4 is not drawn to scale with the vertical displacement exaggerated for illustrative purposes, and the maximum vertical displacement is a fraction of the horizontal surface area comprising the PMUT device 100. In an example PMUT device 100, maximum vertical displacement may be measured in nanometers, while surface area of an individual PMUT device 100 may be measured in square microns.

Figure 5:
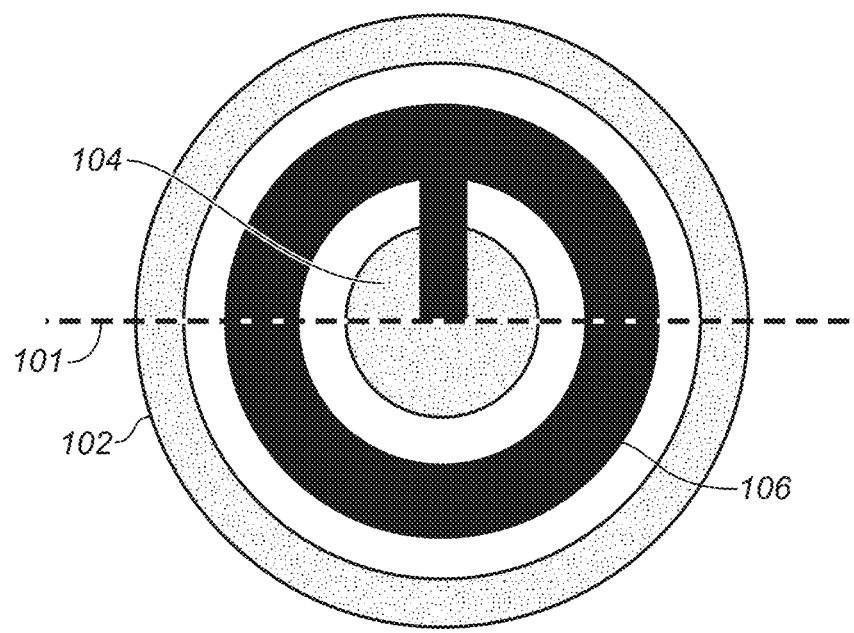
FIG. 5 is a top view of an example PMUT device having a circular shape, according to some embodiments.

FIG. 5 is a top view of another example of the PMUT device 100 of FIG. 1A having a substantially circular shape, which corresponds in part to a cross section along dotted line 101 in FIG. 5. Layout of surrounding edge support 102, interior support 104, and lower electrode 106 are illustrated, with other continuous layers not shown. It should be appreciated that the term "substantially" in "substantially circular shape" is intended to convey that a PMUT device 100 is generally circle-shaped, with allowances for variations due to manufacturing processes and tolerances, and that slight deviation from a circle shape (e.g., slight deviations on radial distance from center, etc.) may be present in a manufactured device.

Figure 6:
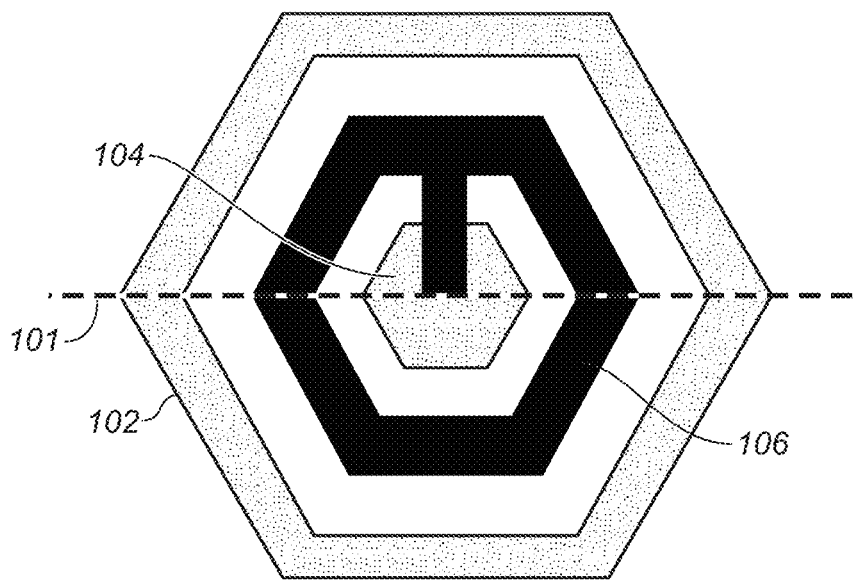
FIG. 6 is a top view of an example PMUT device having a hexagonal shape, according to some embodiments.

FIG. 6 is a top view of another example of the PMUT device 100 of FIG. 1A having a substantially hexagonal shape, which corresponds in part to a cross section along dotted line 101 in FIG. 6. Layout of surrounding edge support 102, interior support 104, and lower electrode 106 are illustrated, with other continuous layers not shown. It should be appreciated that the term "substantially" in "substantially hexagonal shape" is intended to convey that a PMUT device 100 is generally hexagon-shaped, with allowances for variations due to manufacturing processes and tolerances, and that slight deviation from a hexagon shape (e.g., rounded corners, slightly wavering lines, deviations from perfectly orthogonal corners or intersections, etc.) may be present in a manufactured device.

Figure 7:
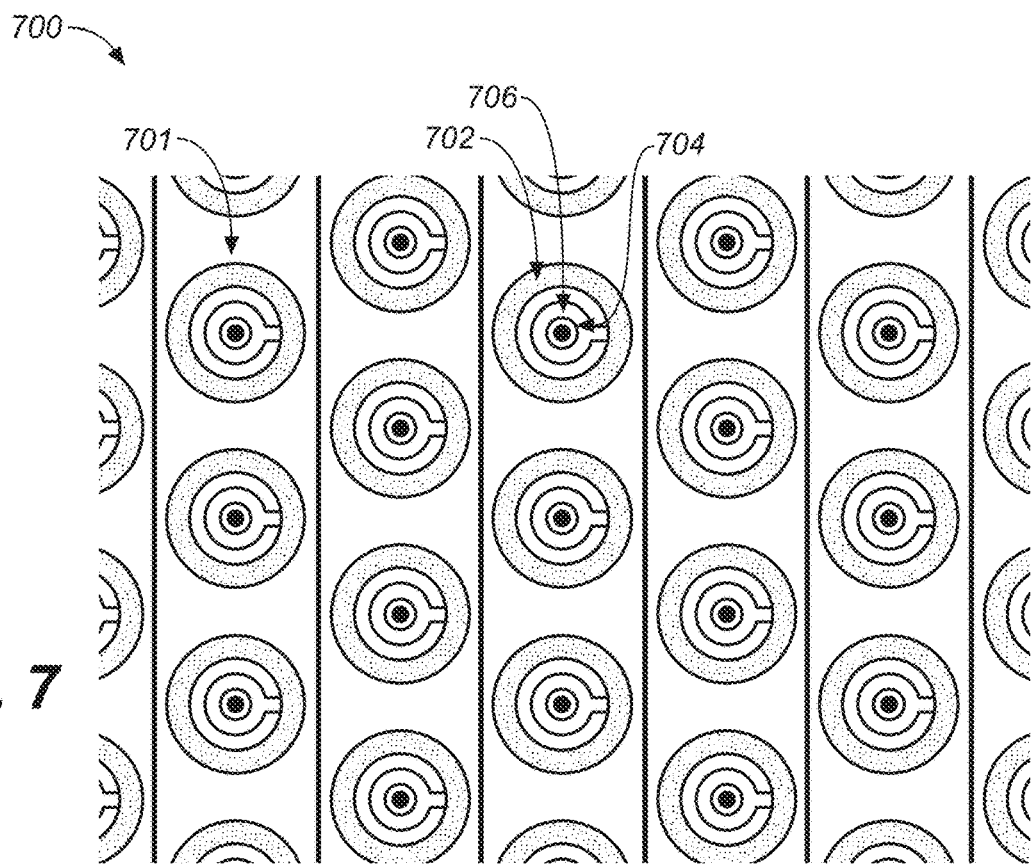
FIG. 7 illustrates an example array of circular-shaped PMUT devices, according to some embodiments.

FIG. 7 illustrates an example two-dimensional array 700 of circular-shaped PMUT devices 701 formed from PMUT devices having a substantially circular shape similar to that discussed in conjunction with FIGS. 1A, 2 and 5. Layout of circular surrounding edge support 702, interior support 704, and annular or ring shaped lower electrode 706 surrounding the interior support 704 are illustrated, while other continuous layers are not shown for clarity. As illustrated, array 700 includes columns of circular-shaped PMUT devices 701 that are offset. It should be appreciated that the circular-shaped PMUT devices 701 may be closer together, such that edges of the columns of circular-shaped PMUT devices 701 overlap. Moreover, it should be appreciated that circular-shaped PMUT devices 701 may contact each other. In various embodiments, adjacent circular-shaped PMUT devices 701 are electrically isolated. In other embodiments, groups of adjacent circular-shaped PMUT devices 701 are electrically connected, where the groups of adjacent circular-shaped PMUT devices 701 are electrically isolated.

Figure 8:
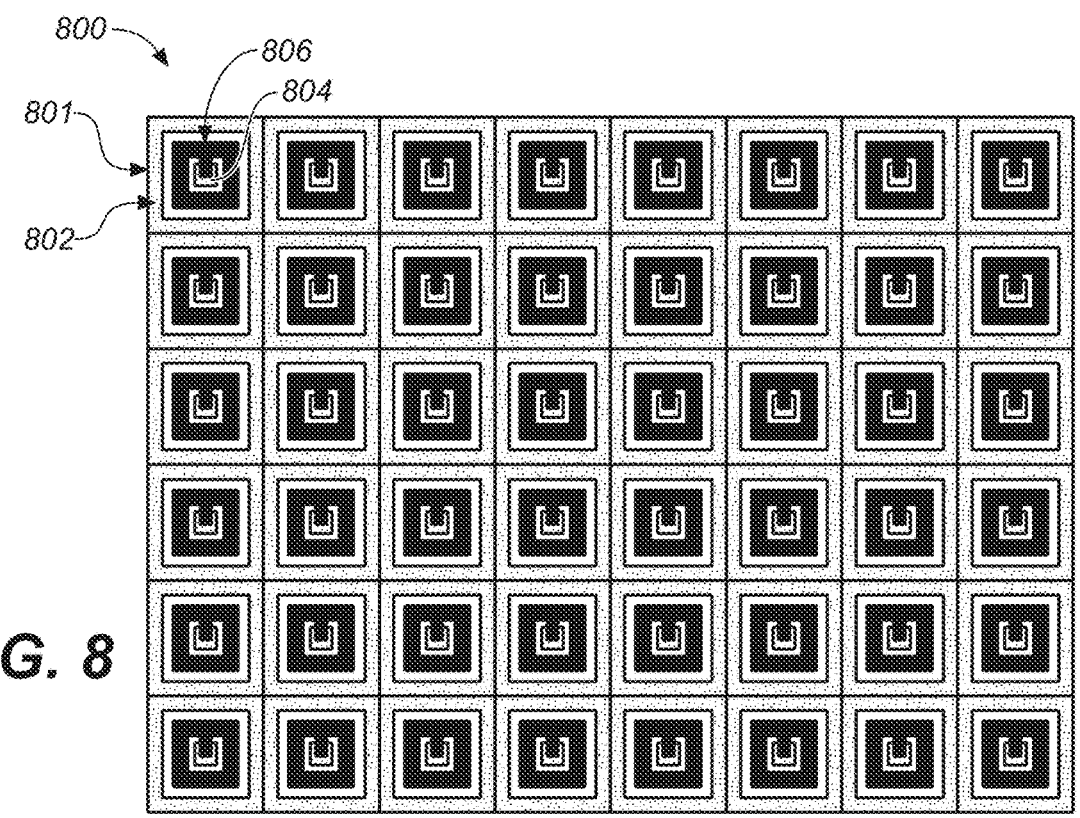
FIG. 8 illustrates an example array of square-shaped PMUT devices, according to some embodiments.

FIG. 8 illustrates an example two-dimensional array 800 of square-shaped PMUT devices 801 formed from PMUT devices having a substantially square shape similar to that discussed in conjunction with FIGS. 1A, 2 and 3. Layout of square surrounding edge support 802, interior support 804, and square-shaped lower electrode 806 surrounding the interior support 804 are illustrated, while other continuous layers are not shown for clarity. As illustrated, array 800 includes columns of square-shaped PMUT devices 801 that are in rows and columns. It should be appreciated that rows or columns of the square-shaped PMUT devices 801 may be offset. Moreover, it should be appreciated that square-shaped PMUT devices 801 may contact each other or be spaced apart. In various embodiments, adjacent square-shaped PMUT devices 801 are electrically isolated. In other embodiments, groups of adjacent square-shaped PMUT devices 801 are electrically connected, where the groups of adjacent square-shaped PMUT devices 801 are electrically isolated.

Figure 9:
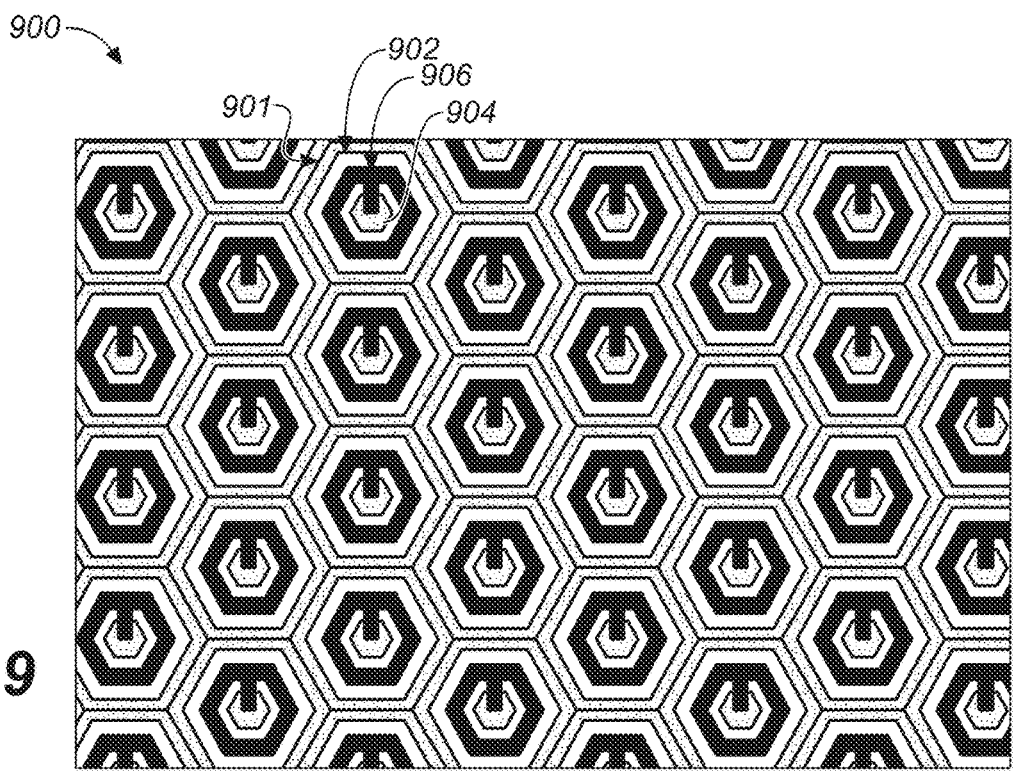
FIG. 9 illustrates an example array of hexagonal-shaped PMUT devices, according to some embodiments.

FIG. 9 illustrates an example two-dimensional array 900 of hexagon-shaped PMUT devices 901 formed from PMUT devices having a substantially hexagon shape similar to that discussed in conjunction with FIGS. 1A, 2 and 6. Layout of hexagon-shaped surrounding edge support 902, interior support 904, and hexagon-shaped lower electrode 906 surrounding the interior support 904 are illustrated, while other continuous layers are not shown for clarity. It should be appreciated that rows or columns of the hexagon-shaped PMUT devices 901 may be offset. Moreover, it should be appreciated that hexagon-shaped PMUT devices 901 may contact each other or be spaced apart. In various embodiments, adjacent hexagon-shaped PMUT devices 901 are electrically isolated. In other embodiments, groups of adjacent hexagon-shaped PMUT devices 901 are electrically connected, where the groups of adjacent hexagon-shaped PMUT devices 901 are electrically isolated. While FIGS. 7, 8 and 9 illustrate example layouts of PMUT devices having different shapes, it should be appreciated that many different layouts are available. Moreover, in accordance with various embodiments, arrays of PMUT devices are included within a MEMS layer.

In operation, during transmission, selected sets of PMUT devices in the two-dimensional array can transmit an acoustic signal (e.g., a short ultrasonic pulse) and during sensing, the set of active PMUT devices in the two-dimensional array can detect an interference of the acoustic signal with an object (in the path of the acoustic wave). The received interference signal (e.g., generated based on reflections, echoes, etc. Of the acoustic signal from the object) can then be analyzed. As an example, an image of the object, a distance of the object from the sensing component, a density of the object, a motion of the object, etc., can all be determined based on comparing a frequency and/or phase of the interference signal with a frequency and/or phase of the acoustic signal. Moreover, results generated can be further analyzed or presented to a user via a display device (not shown).

FIG. 10 illustrates a pair of example PMUT devices 1000 in a PMUT array, with each PMUT sharing at least one common edge support 1002. As illustrated, the PMUT devices have two sets of independent lower electrode labeled as 1006 and 1026. These differing electrode patterns enable antiphase operation of the PMUT devices 1000, and increase flexibility of device operation. In one embodiment, the pair of PMUTs may be identical, but the two electrodes could drive different parts of the same PMUT antiphase (one contracting, and one extending), such that the PMUT displacement becomes larger. While other continuous layers are not shown for clarity, each PMUT also includes an upper electrode (e.g., upper electrode 108 of FIG. 1A). Accordingly, in various embodiments, a PMUT device may include at least three electrodes.

FIGS. 11A, 11B, 11C, and 11D illustrate alternative examples of interior support structures, in accordance with various embodiments. Interior supports structures may also be referred to as "pinning structures," as they operate to pin the membrane to the substrate. It should be appreciated that interior support structures may be positioned anywhere within a cavity of a PMUT device, and may have any type of shape (or variety of shapes), and that there may be more than one interior support structure within a PMUT device. While FIGS. 11A, 11B, 11C, and 11D illustrate alternative examples of interior support structures, it should be appreciated that these examples or for illustrative purposes, and are not intended to limit the number, position, or type of interior support structures of PMUT devices.

Figure 11A:
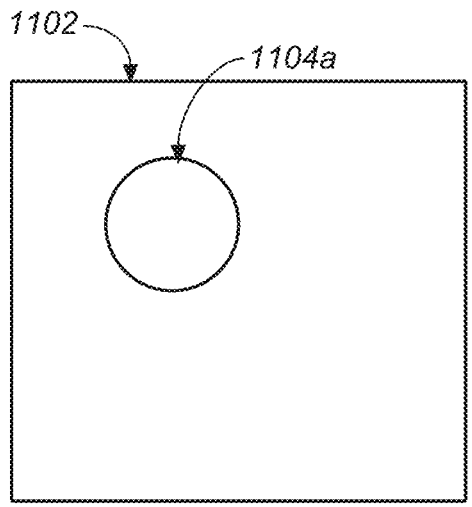
FIGS. 11A, 11B, 11C, and 11D illustrate alternative examples of interior support structures, according to various embodiments.
Figure 11B:
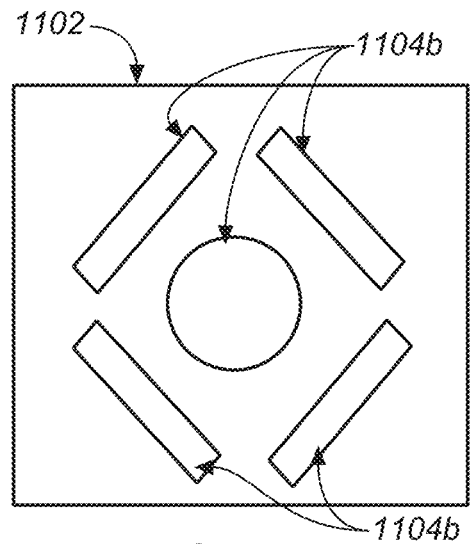
Figure 11C:
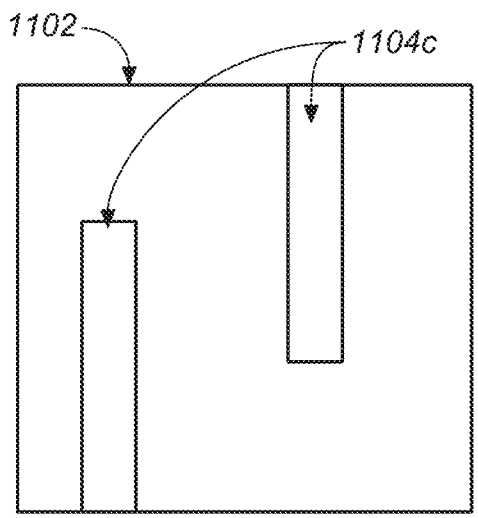
Figure 11D:
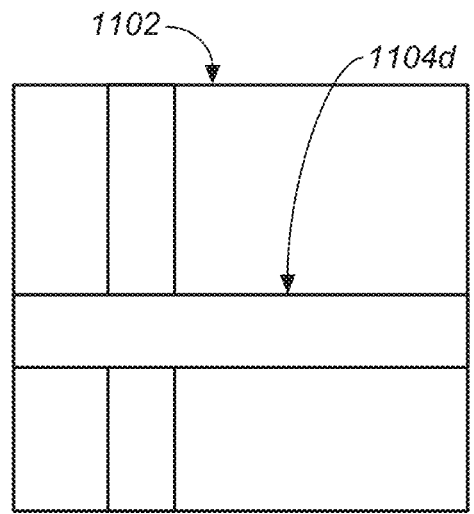

For example, interior supports structures do not have to be centrally located with a PMUT device area, but can be non-centrally positioned within the cavity. As illustrated in FIG. 11A, interior support 1104*a* is positioned in a non-central, off-axis position with respect to edge support 1102. In other embodiments such as seen in FIG. 11B, multiple interior supports 1104*b* can be used. In this embodiment, one interior support is centrally located with respect to edge support 1102, while the multiple, differently shaped and sized interior supports surround the centrally located support. In still other embodiments, such as seen with respect to FIGS. 11C and 11D, the interior supports (respectively 1104*c* and 1104*d*) can contact a common edge support 1102. In the embodiment illustrated in FIG. 11D, the interior supports 1104*d* can effectively divide the PMUT device into subpixels. This would allow, for example, activation of smaller areas to generate high frequency ultrasonic waves, and sensing a returning ultrasonic echo with larger areas of the PMUT device. It will be appreciated that the individual pinning structures can be combined into arrays.

Figure 12:
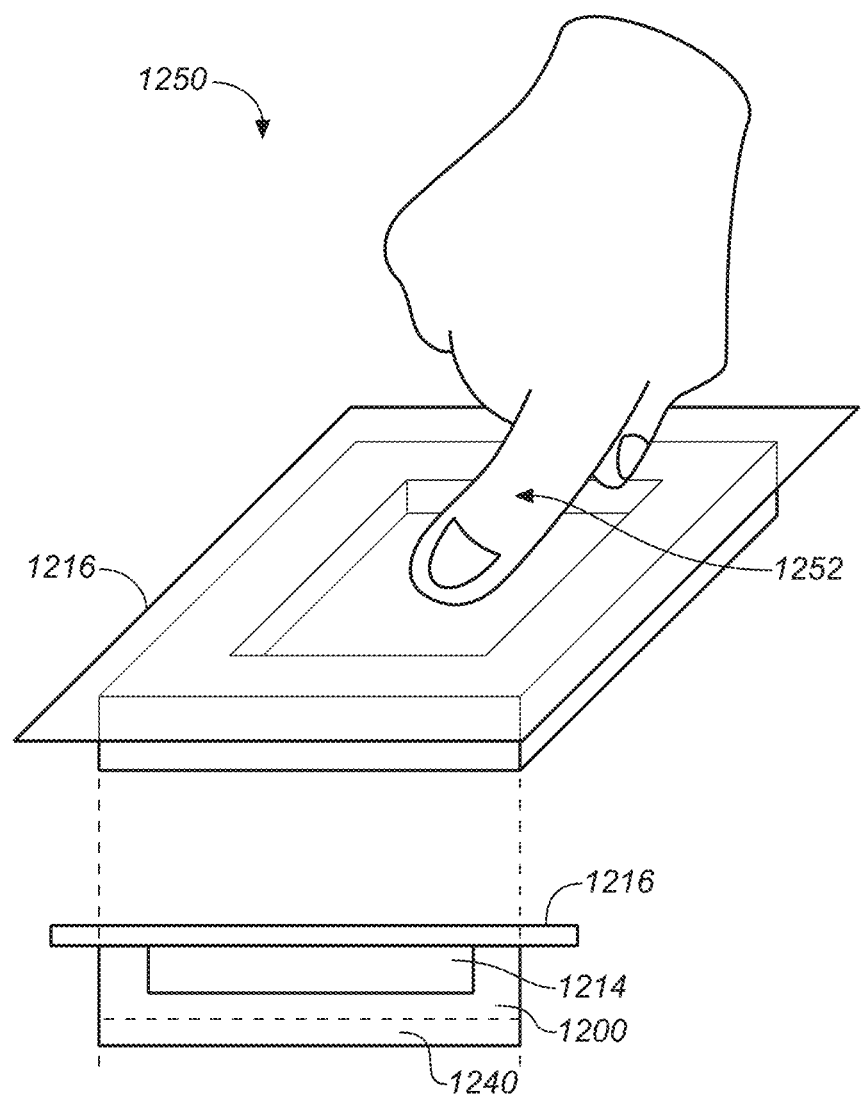
FIG. 12 illustrates a PMUT array used in an ultrasonic fingerprint sensing system, according to some embodiments.

FIG. 12 illustrates an embodiment of a PMUT array used in an ultrasonic fingerprint sensing system 1250. The fingerprint sensing system 1250 can include a platen 1216 onto which a human finger 1252 may make contact. Ultrasonic signals are generated and received by a PMUT device array 1200, and travel back and forth through acoustic coupling layer 1214 and platen 1216. Signal analysis is conducted using processing logic module 1240 (e.g., control logic) directly attached (via wafer bonding or other suitable techniques) to the PMUT device array 1200. It will be appreciated that the size of platen 1216 and the other elements illustrated in FIG. 12 may be much larger (e.g., the size of a handprint) or much smaller (e.g., just a fingertip) than as shown in the illustration, depending on the particular application.

In this example for fingerprinting applications, the human finger 1252 and the processing logic module 1240 can determine, based on a difference in interference of the acoustic signal with valleys and/or ridges of the skin on the finger, an image depicting epi-dermis and/or dermis layers of the finger. Further, the processing logic module 1240 can compare the image with a set of known fingerprint images to facilitate identification and/or authentication. Moreover, in one example, if a match (or substantial match) is found, the identity of user can be verified. In another example, if a match (or substantial match) is found, a command/operation can be performed based on an authorization rights assigned to the identified user. In yet another example, the identified user can be granted access to a physical location and/or network/computer resources (e.g., documents, files, applications, etc.)

In another example, for finger-based applications, the movement of the finger can be used for cursor tracking/movement applications. In such embodiments, a pointer or cursor on a display screen can be moved in response to finger movement. It is noted that processing logic module 1240 can include or be connected to one or more processors configured to confer at least in part the functionality of system 1250. To that end, the one or more processors can execute code instructions stored in memory, for example, volatile memory and/or nonvolatile memory.

Figure 13:
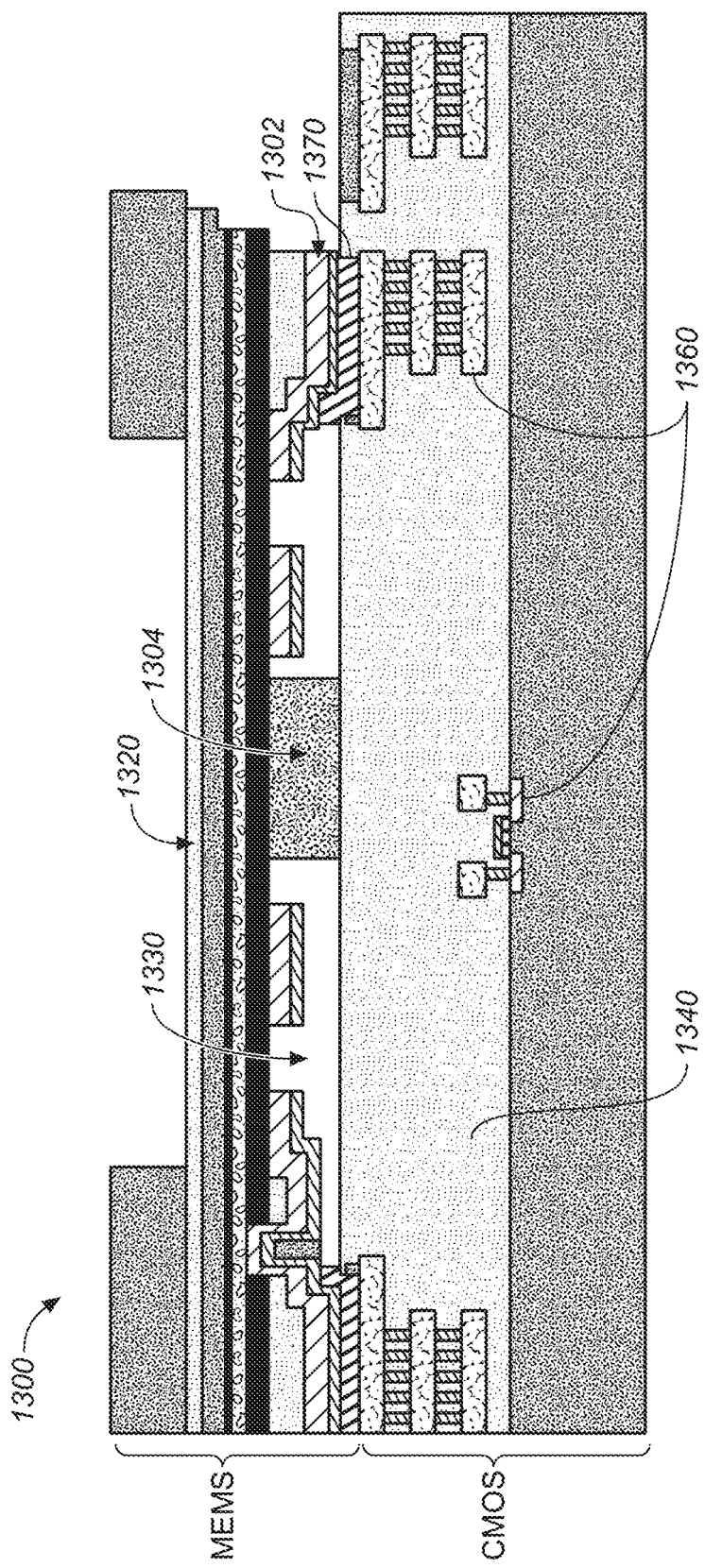
FIG. 13 illustrates in partial cross-section one embodiment of an integrated sensor, such as a fingerprint sensor, formed by wafer bonding a complementary metal oxide semiconductor (CMOS) logic wafer and a microelectromechanical (MEMS) wafer defining PMUT devices.

FIG. 13 illustrates an integrated sensor 1300 formed by wafer bonding a CMOS logic wafer and a MEMS wafer defining PMUT devices, according to some embodiments. FIG. 13 illustrates in partial cross section one embodiment of an integrated sensor formed by wafer bonding a substrate 1340 CMOS logic wafer and a MEMS wafer defining PMUT devices (e.g., PMUT device 100, 100') having a common edge support 1302 and separate interior support 1304, although in some embodiments, the interior support 1304 may be absent, as in FIG. 1B. For example, the MEMS wafer may be bonded to the CMOS logic wafer using aluminum and germanium eutectic alloys, as described in U.S. Pat. No. 7,442,570, via layer 1370. PMUT device 1300 has an interior pinned membrane 1320 (including a piezoelectric layer) formed over a cavity 1330. The membrane 1320 is attached both to a surrounding edge support 1302 and interior support 1304. The membrane 1320 is formed from multiple layers. In accordance with various embodiments, an integrated fingerprint sensor is made of multiple integrated sensor elements 1300 (or devices) arranged in a one- or two-dimensional array. Each device is defined by edge supports 1302 that bond the MEMS layer and the CMOS layer. Applications other than a PMUT may be supported, provided that a MEMS array with multiple elements is used.

The CMOS layer includes control electronics 1360. In various embodiments, control electronics 1360 are a sophisticated, mixed-signal design fabricated through Complementary Metal Oxide Semiconductor (CMOS) processes. In various embodiments, control electronics 1360 include low voltage (LV) digital logic to select an element (or pixel) in the array and to control behavior at the element level and include LV analog signal processing of a received signal (e.g., ultrasonic waveform). The control electronics includes high voltage (HV) devices that are used to actuate, amplify, or condition a signal transduced between the electrical domain on the one hand, and the mechanical domain on the other. The HV devices comprise separate NMOS and PMOS sections with respective transistors using negative channel or positive channel transmission. In the case of a PMUT, HV devices are used to generate a high voltage actuation waveform that is applied to a piezoelectric layer of membrane 1320 to transduce a signal from the electrical domain to the ultrasound domain. In various embodiments, the LV devices include separate NMOS and PMOS sections.

It may also be possible to integrate the MEMS and CMOS elements at a die level, rather than a wafer level. FIG. 13 illustrates an aspect ratio with layers substantially thicker than an actual device for clarity. FIG. 13 further illustrates a relatively symmetric and simplified cartoon of control electronics 1360 with much detail of an example six-layer CMOS process omitted.

In some embodiments, a two-dimensional array of individual PMUT devices (e.g., PMUT device 100 of FIG. 1A or 100' of FIG. 1B) corresponds with a two-dimensional array of control electronics. This embodiment also applies to other types of MEMS arrays with integrated control electronics. This includes, but is not limited to, applications for inertial sensors, optical devices, display devices, pressure sensors, microphones, inkjet printers, and other applications of MEMS technology with integrated mixed-signal electronics for control. It should be appreciated that while the described embodiments may refer CMOS control elements for controlling MEMS devices and/or PMUT devices, that the described embodiments are not intended to be limited to such implementations.

Figure 14:
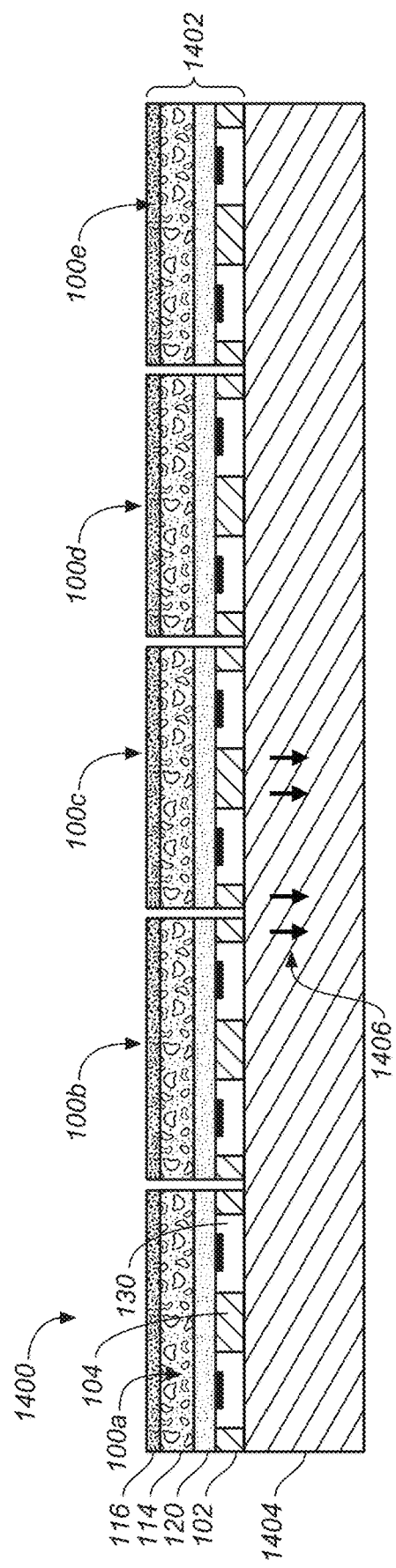
FIG. 14 illustrates an example electronic device, according to an embodiment.

FIG. 14 illustrates a cut-away side view of an example electronic device 1400, according to an embodiment. For example, electronic device 1400 may be part of a fingerprint image sensing system for imaging and sensing a human fingerprint. In one embodiment, electronic device 1400 includes a device layer 1402 (e.g., a MEMS layer) and a substrate layer 1404, e.g., a CMOS substrate. In the illustrated embodiment, five PMUT devices 100 (illustrated as PMUT devices 100a-e) of FIG. 1A are shown. However, it should be appreciated that electronic device 1400 may include any number of PMUT devices 100 or PMUT device 100' of FIG. 1B, ultrasonic transducers (or other devices). Moreover, it should be appreciated that while a cut-away view is illustrated, that only a single row (or portion thereof) of device layer 1402 and substrate layer 1404 is shown, and that device layer 1402 and substrate layer 1404 may include arrays of corresponding components, such as two-dimensional arrays. Further, an interconnect layer (not shown) may be formed in substrate layer 1404 for connecting one or more PMUT devices to one or more control elements (e.g., CMOS control elements) in substrate layer 1404. It should be appreciated that while FIG. 14 illustrates PMUT devices 100a-e as separate devices, they may be part of a continuous layer of PMUT devices.

During operation, PMUT devices 100 of electronic device 1400 generate the ultrasonic waves through the vibrations of membrane 120, and through contact with the acoustic coupling layer, these waves propagate in the upward direction towards platen layer 116. The reflected ultrasonic waves, for example after interaction with an object on platen layer 116, are reflected back and detected by the transducers. However, the ultrasonic waves may also travel in other unwanted directions, such as in the backward direction towards a substrate layer, such as e.g. substrate layer 1404, as illustrated by arrows 1406. The backward waves may propagate through cavity 130 and any support structures, such as e.g. support structures 102 and 104. It should be appreciated that in some embodiments, the edge support structures 102 of neighboring PMUT devices may be formed as a single support structure used as support for all neighboring PMUT devices. If cavity 130 has a vacuum, transmission of the waves through the cavity may be decreased or may be negligible or substantially smaller than the transmission of waves via support structures 102 and 104. In this case, the points of transmission of the backward waves into the substrate are the support structures 102 and 104. The backwards waves may be reflected from any layer in their path, for example any layer, transition, or feature in the substrate with a sufficiently high acoustic impedance mismatch to initiate reflection of the backward waves. Reflection of the backward waves would mean these waves would then travel in the direction of membrane 120, and would mean that these backward waves would be detected and may interfere with the waves reflected from the forward direction. Detection of the reflected backward waves is not desired since this may deteriorate the quality of the signal from the forward waves. For example, this may decrease the signal to noise ratio because the backward waves contribute to the noise. When an array of transducers is used to create an image of an object in contact with platen layer 116, the reflected backward waves may create an unwanted ground image that is added to the image of the object.

To improve the quality of the detected signal (e.g., an image) from the waves reflected of the object in contact with platen layer 116, it is important to minimize any unwanted contribution from reflected backward waves. Embodiments to achieve this objective can be roughly classified into different classes of embodiments. A first class of embodiments may be aimed at minimizing the generation of reflected backward waves that could ultimately be detected and interfere with the signal. A second class of embodiments may be aimed at minimizing the creation of the backward waves. A third class of embodiments may be aimed at operating the array of transducers in a manner to minimize the generation and/or detection of the backward reflected waves.

The following discussion describes example embodiments using the ultrasonic fingerprint sensing system of ultrasonic transducers described in FIGS. 1 through 13 above. However, it should be noted that the same principles may be applied to other architectures or other types of ultrasonic sensors, where backward or other secondary ultrasonic waves exists that may interfere with the image generation. In other sensor architectures, the transmission and/or receiving of the ultrasonic waves may be accomplished through other means than an array of ultrasonic transducers, and the generation and detection of the ultrasonic waves may be performed by different structures and/or layers within the sensor stack. For example, the ultrasonic waves may be generated by a dedicated layer or film in the sensor stack (e.g., a piezo electric film), where this layer generates a generally planar ultrasound wave. Such a device may also generate backward waves that can be reflected from a substrate. Minimization of the unwanted reflections in such devices will improve the imaging quality of the sensor. These unwanted reflections may come from the back of the substrate or any other feature or structure within the sensor stack or other parts of the sensor module or mounting substrate.

FIGS. 15A through 15G illustrate various examples of electronic devices including features for reducing a contribution from reflected backward waves during operation, in accordance with various embodiments. In the first class of embodiments, embodiments may have a substrate, e.g., substrate layer 1404, that minimizes the reflection of the backward waves, for example through the use of acoustic absorption materials or specific shapes, form, or pattern on one or more of the surfaces or layers of the substrate, e.g., substrate structures.

Figure 15A:
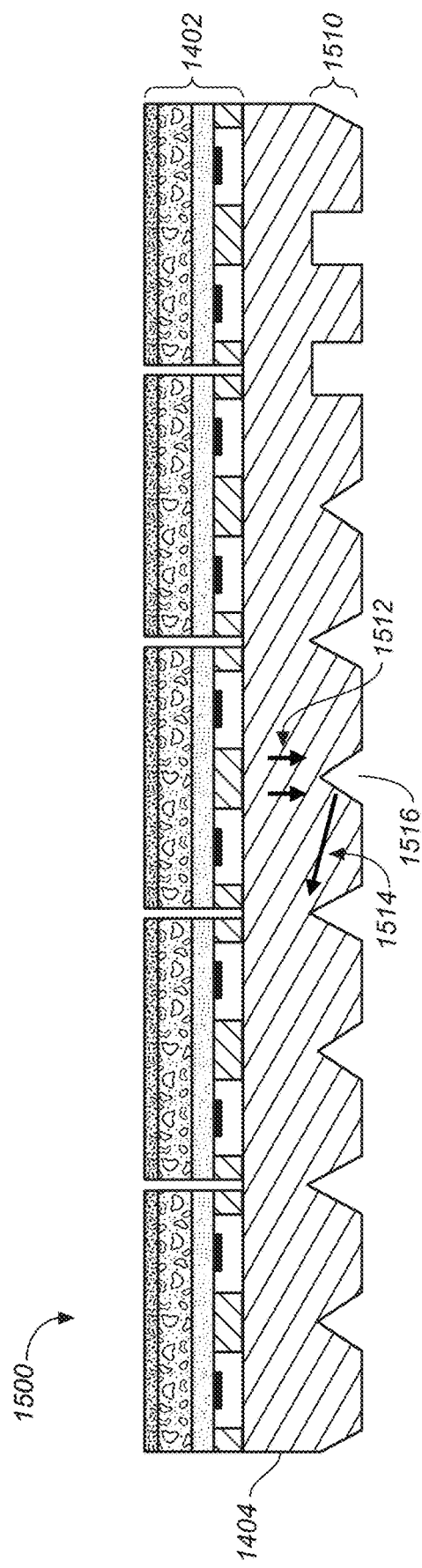
Figure 15B:
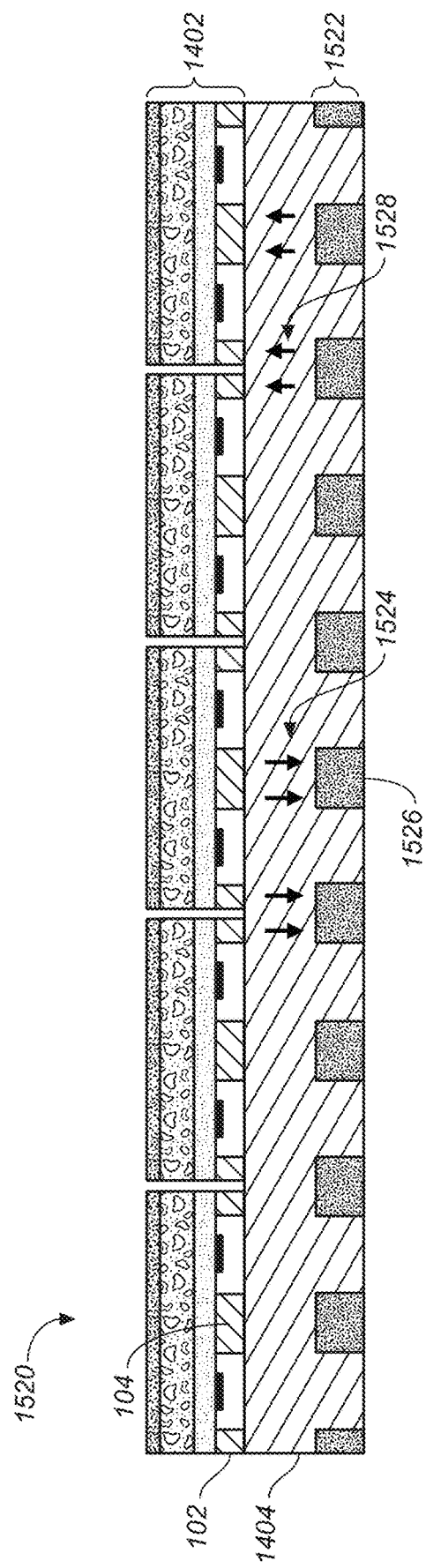
Figure 15C:
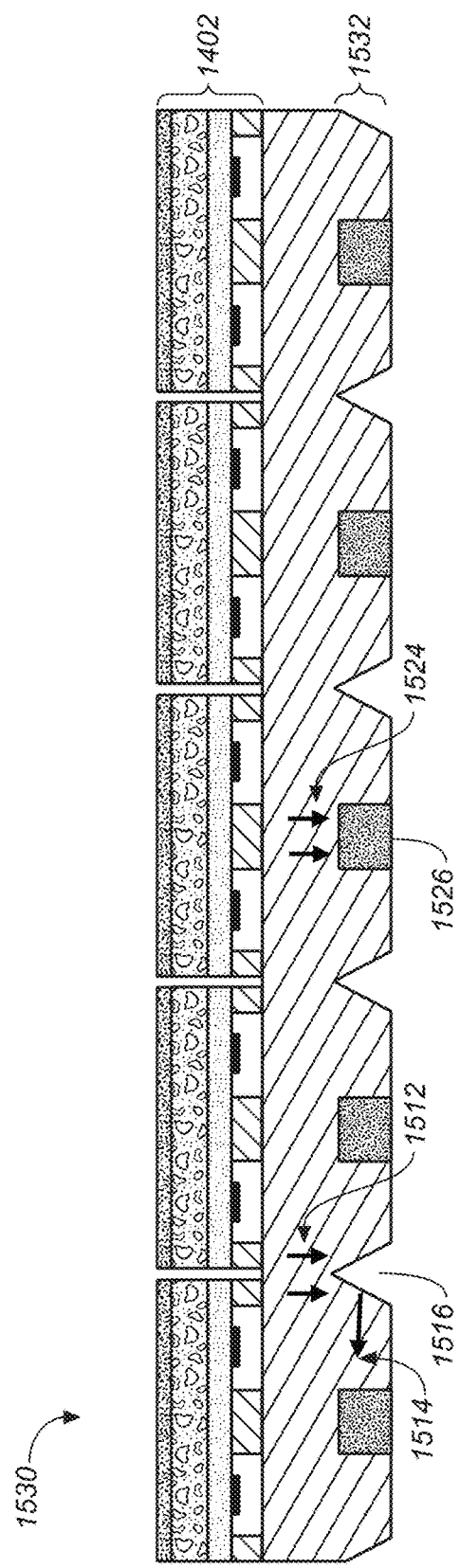

In some embodiments, as illustrated in FIGS. 15A through 15C, the back surface of the substrate layer 1404, opposite to the transducers, may be structured to decrease the reflection or to control the direction of the reflection. Furthermore, in addition, any hollows, spaces, or indentations created by the structuring or patterning, may be filled, completely or partially with acoustic absorption material. Any of these substrate structures may be one dimensional, two dimensional, or three dimensional.

With reference to FIG. 15A, electronic device 1500 includes substrate layer 1404 including a structured layer 1510. Structured layer 1510 includes scattering structures 1516 (e.g., triangular and rectangular in cross-section) for deflecting backward waves away from device layer 1402 during operation. As illustrated, during operation, backward waves 1512 are generated by ultrasonic transducers of device layer 1402. Backward waves 1512 are reflected off structure 1516, resulting in reflected backward waves 1514, where reflected backward waves do not reflect back directly towards substrate layer 1404. It should be appreciated that while some of reflected backward waves 1514 may ultimately be directed back towards device layer 1402, the angling of reflected backward waves 1514 reduces the impact of the reflected backward waves 1514 in the operation of electronic device 1500. The width and depth of scattering structures 1516 may depend on the dimensions on the PMUT devices, such as e.g. the width and spacing of the support structures. For example, scattering structures 1516 and may have dimensions that are a predefined ratio of the support structures. Furthermore, the width, depth and/or shape of scattering structures 1516 may also depend on the operating characteristics of the PMUT devices, such as e.g. the frequency/wavelength of the generated waves. When triangular structures are used, the angles may be selected to generate a certain scattering angle, and direct the reflected waves 1514 in a certain direction, or e.g. to optimize internal reflection of the waves within the substrate.

Although FIG. 15A shows triangular and rectangular scattering structures 1516, it should be appreciated that the scattering structures 1516 may take any shape or combination of shapes. These shapes may be simple, such as e.g. rectangular or (semi-) circular, or may have complex shapes. The shape and dimensions may be optimized to create destructive interference, thereby reducing the backward reflected waves. For example, if the scattering structures would be rectangular, the depth of the structures may be a quarter wavelength (or an integer value+a quarter). As a result, the waves that scattering from the top of the scattering structure and the waves scattering from the bottom of the substrate would be half a wavelength out of phase, thereby resulting in destructive interference. The quarter wavelength depth can be calculated based on the speed of sound in the substrate material and the frequency of the ultrasonic waves. Other scattering structures may also be designed to take advantage of destructive interference by creating scattered waves that are half a wavelength out of phase.

With reference to FIG. 15B, electronic device 1520 includes substrate layer 1404 including an absorption layer 1522. Absorption layer 1522 includes acoustic absorption material filled within indentations of substrate layer 1404 (absorption structures 1526), absorbing backward waves away from device layer 1402 during operation. The acoustic properties of the material used for absorption layer 1522 can be tuned to the characteristics of the waves. The absorption layer 1522 may extend the complete width of the support structure, or may be discontinuous. As illustrated, during operation, backward waves 1524 are generated by ultrasonic transducers of device layer 1402. Backward waves 1524 are absorbed by absorption structures 1526, resulting in reduction of reflection of backward waves 1524. It should be appreciated that while some of reflected backward waves 1528 may ultimately be directed back towards device layer 1402, the reduction of reflected backward waves 1514 reduces the impact of the reflected backward waves 1528 in the operation of electronic device 1520. The absorption structures 1526 may be aligned with specific sections of the PMUT devices, such as support structures 102 and 104. The absorption structures 1526 related to support structures 102 and 104 may be similar, or may be adapted to specifics (e.g., dimensions) of the respective support structures. For example, the larger the support structure, the larger the corresponding absorption structure, since more backward waves may be generated. The width, depth, and/or shape of the absorption structures 1526 may be defined with respect to the dimension of the corresponding support structure. Furthermore, the width, depth and/or shape of the absorption structures 1526 may depend on the wavelength of the waves in the substrate layer 1404. As discussed in relation to FIG. 15A, the dimensions of the absorption structures 1526 may be chosen to favor destructive interference, thereby combined absorption effects and interference effect for reduction of the backscattered waves. In some embodiments, the absorbing material has a high attenuation coefficient, good impedance match with the substrate material, and a high glass-transition temperature so that the properties do not change drastically over the operating temperature range of the device. The absorption material may be a single material or single layer. However, the absorption material may also comprise multiple layers. For example, by using multiple layers with different acoustic impedances, the coupling of the waves into the absorption material from the substrate may be enhanced.

With reference to FIG. 15C, electronic device 1530 includes substrate layer 1404 including a structured and absorption layer 1532. Structured and absorption layer 1532 includes scattering structures 1516 and absorption structures 1526. While electronic device 1530 includes scattering structures 1516 for receiving backward waves 1512 from support structures 102 and absorption structures 1526 for receiving backward waves 1524 from support structures 104, it should be appreciated that scattering structures 1516 and absorption structures 1526 can be arranged in any manner. Moreover, it should be appreciated that scattering structures 1516 may also include an absorption material. The arrangement of scattering structures 1516 and absorption structures 1526 may be such that the waves scattered from scattering structures 1516 are directed towards absorption structures 1526, either directly or indirectly. The width, depth, and/or shape of the scattering structures 1516 and absorption structures 1526 may be defined with respect to the dimension of the corresponding support structure. Furthermore, the width, depth and/or shape of the absorption structures 1526 may depend on the wavelength of the waves in the substrate layer 1404.

In the second class of embodiments, the embodiments may include at least one of adapting the support structures, adapting the cavity and adapting the membrane in order to decrease the generation or transmission of the backward waves (into the substrate). In embodiments related to the cavity, the cavity may be a vacuum to decrease propagation of the waves (as discussed above in relation to FIG. 1A, FIG. 1B, and FIG. 2). The side of the cavity on the substrate may comprise an acoustic absorption layer, and may be structured to minimize reflection (details discussed below in relation to embodiments modifying the substrate).

Embodiments that modify the support structures of PMUT devices 100 are discussed in relation to FIG. 15D. As shown in FIG. 15D, the shape of the support structures 102 and 104 is adapted to minimize transmission of (e.g., perpendicular) backward waves through the points of transmission or contact with the substrate, attempting to diffuse (e.g., waves 1544) or focus (e.g., waves 1542) the direction of backward waves 1542 and 1544. The support structures 102 and 104 may be, e.g., of trapezoid shape as shown in FIG. 15D, but it should be appreciated that support structures 102 and 104 may have any other shape of (monotonic) changing width, e.g., a step wise decrease. The shape of the support structure influences the stiffness of the support structure. The creating of the backward waves that travel into the support structure depends on the ratio of the stiffness of the membrane and the stiffness of the support structures. A low stiffness ratio is desirable, meaning the stiffness of the support structure is higher than the stiffness of the membrane, because this reduces the generation of the backward waves. In some embodiments, support structures 102 and/or 104 have non-vertical sidewalls for providing control over the stiffness of the support structures 102 and/or 104. For example, a pyramid-like shaped support structure, where the base is wider than the contact point with the membrane, has a higher stiffness then support structures with parallel walls. Moreover, it should be appreciated that the trapezoid shape may be aligned such that the narrow portion is contacting substrate layer 1404 or the broader portion is contacting substrate layer 1404. In another embodiment, substrate layer 1404 includes at least one absorption layer 1522 (e.g., as illustrated in FIG. 2) to absorb any waves that travel into the support structure. The acoustic properties of the material used for these layers can be tuned to the characteristics of the waves. The layer may extend the complete width of the support structure, or may be discontinuous. It should be appreciated that any embodiments from the first class of embodiments described in relation to FIGS. 15A-C may be combined with embodiments from the second class of embodiments to further minimize the contribution of the reflected waves to the useful acoustic signal. For example, a support structure with a narrow base in contact with the substrate will more closely resemble a point source that generated circular back scattered waves, while a support structure with a wide base in contact with the substrate, will more generated more planar back scattered waves. Consequently, the properties of the scattering structures and absorption structures discussed above may be adapted depending on the type of waves generated by the support structures. For example, a support structure with a wide base that generate planar waves generate more energy in the forward direction, and thus may be used in combination with more scattering/absorption structures located and designed to deal with the forward energy.

In one or more embodiments, membrane 120 may be adapted to decrease transmission to the vibrations into the support structures. For example, the membrane may not be of uniform thickness. The thickness may be smaller towards the support structures, or the thickness may be larger towards the support structures. Membrane 120 can be made thinner near the support structures, thus making membrane 120 more compliant than the support structures. Similar to the discussion above, this leads to the stiffness of the support structures being higher than the stiffness of membrane 120, and thus provides a low stiffness ratio. This will reduce the motion in the support structures and hence reduce generation of back-propagating waves into the substrate.

The embodiments in the second class may not only be optimized to minimize the generations of the backward waves, but may also be optimized to decrease to transmission of the reflected backward waves back to the membrane where the reflected backward waves would be detected. These measures may also be combined with above mentioned embodiments. For example, the support structures may have a concave or convex form, with either a maximum or minimum in width at both ends of the structures, where they make contact with the membrane and the substrate.

In one or more embodiments, the support structures may be modified in one or more of shape, form, and material characteristics to control how the reflected waves are transmitted into the substrate. In other words, the support structures may be designed to work as a lens to control the beam shape or form of the waves as they are injected into the substrate. For example, in one embodiment, the support structure may be adapted so that the acoustic waves injected into the substrate are as uniform or planar as possible. In another embodiment, the support structure may be adapted so that the reflected waves are focused in one or more specific areas of the substrate. For example, these areas may have specific acoustic absorption material.

Figure 15F:
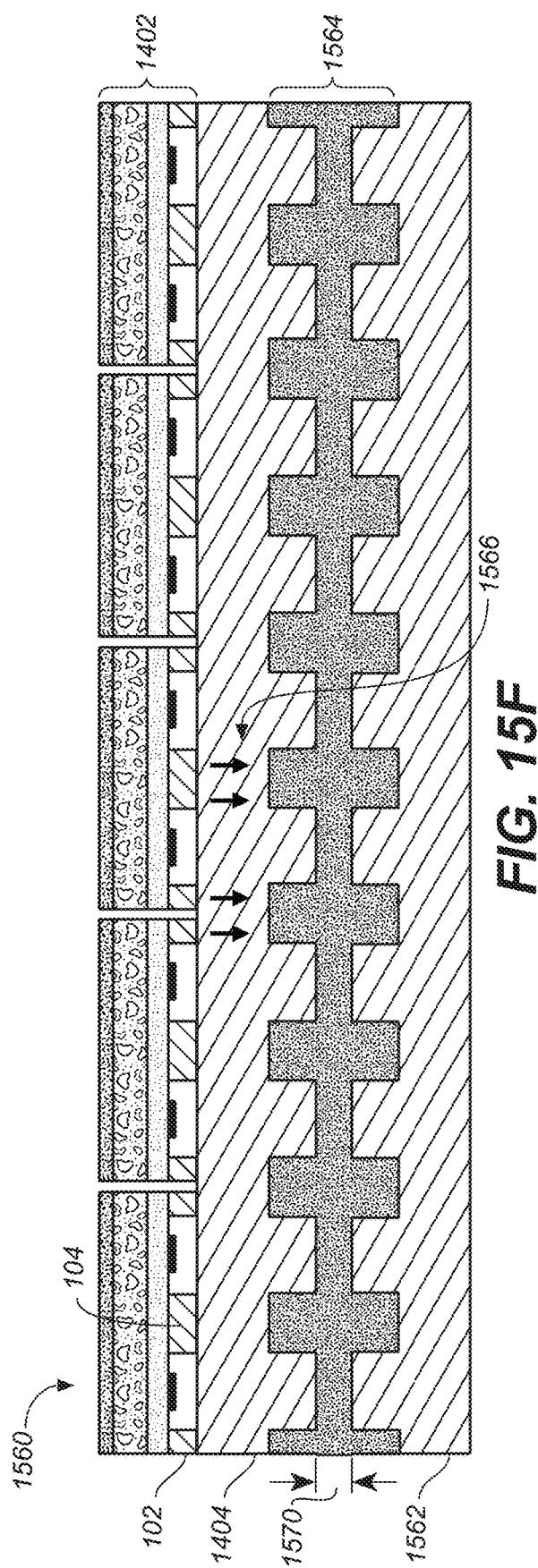

Embodiments that modify the wave absorption properties of an underlying mounting substrate to which the electronic device including ultrasonic sensing devices is connected, e.g., a printed circuit board (PCB), are illustrated in FIGS. 15E and 15F. As shown in FIG. 15E, electronic device 1550 is configured to be connected to mounting substrate 1552. In one embodiment, mounting substrate 1552 is a PCB. Mounting substrate 1552 is patterned to include an absorption layer 1554 including material for absorbing backward waves 1556. In one embodiment, the absorption structures of absorption layer 1554 are aligned with the support structures 102 and 104 of device layer 1402, so as to absorb the backward waves 1556, resulting in reduction of reflection of backward waves 1556. The acoustic properties of the material used for these layers can be tuned to the characteristics of the waves. The layer may extend the complete width of the support structure, or may be discontinuous. The electronic device and/or mounting substrate such as mounting substrate 1552 may have additional structures and/or features (e.g., to facilitate the aligning of the absorption structures with the PMUT devices when the sensor is mounted onto the mounting substrate.

As shown in FIG. 15F, electronic device 1560 is configured to be connected to mounting substrate 1562. In one embodiment, mounting substrate 1562 is a PCB. Substrate layer 1404 and mounting substrate 1562 are patterned to include an absorption layer 1564 including material for absorbing backward waves 1566. In one embodiment, the acoustic absorption structures of absorption layer 1564 patterned in substrate layer 1404 and mounting substrate 1562 are aligned with the support structures 102 and 104 of device layer 1402, so as to absorb the backward waves 1566, resulting in reduction of reflection of backward waves 1566. The acoustic properties of the material used for these layers can be tuned to the characteristics of the waves. The layer may extend the complete width of the support structure, or may be discontinuous. It should be appreciated that absorption layer 1564 can also be a bonding layer (e.g., an epoxy or a glue) that bonds mounting substrate 1562 to substrate layer 1404. Moreover, it should be appreciated that the thickness of absorption layer 1564 at the closest surfaces mounting substrate 1562 to substrate layer 1404, as indicated at distance 1570, can be any distance (e.g., can approach zero).

Minimizing the effect of the backward scattered waves can be achieved by reducing the magnitude of the backward waves through one of the many embodiments discussed above. However, minimizing the effect of the backward waves may also comprise reducing the spatial variation of the backward waves. As discussed above, the backward waves contribute to the background of the image obtained by the device. If this background contribution is uniform for the entire device, the problem is less severe than if the background would have a lot of spatial variation, which then show up as spatial feature in the acquired image. Therefore, any of the embodiments discussed above may also be used to generate uniform backward waves, so that their contribution to the image is as uniform as possible. The contact between the substrate and the mounting substrate may also effect the spatial variation of the backscattered waves. As a result, the structure of the mounting substrate may show up as a background structure in the acquired image. In some embodiments, the position, shaped, and dimensions of the scattering and absorption structures may be adapted to compensate for the effect of the mounting substrate. For example, scattering/absorption structures may be positions as the location where the substrate is in contact with the mounting substrate.

Figure 15G:
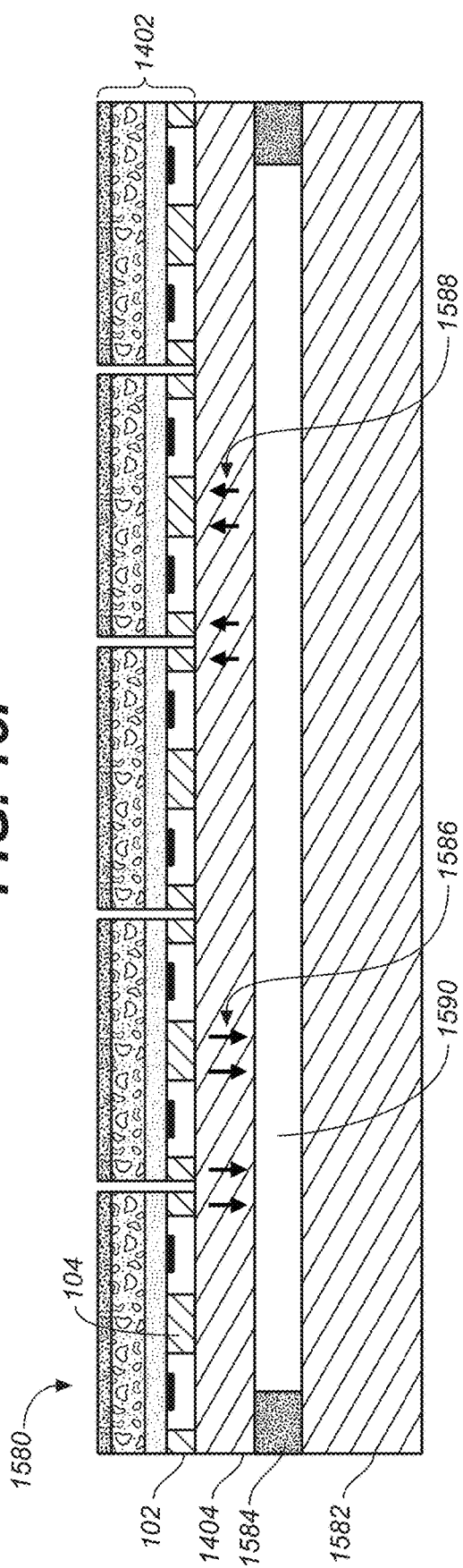

In some embodiments, the contact with the mounting substrate may be minimized. An example embodiment is shown in FIG. 15G. As shown in FIG. 15G, electronic device 1580 is configured to be connected to mounting substrate 1582. In one embodiment, mounting substrate 1582 is a PCB. Substrate layer 1404 and mounting substrate 1582 are coupled via spacers 1584, forming an airgap 1590 between mounting substrate 1582 and substrate layer 1404. In this embodiment, airgap 1590 creates an impedance mismatch between substrate layer 1404 and the air in airgap 1590, and thus most of the acoustic waves are reflected. Thus, the backward waves 1586 generated at the support structures 102 and 104 are uniformly scattered back into substrate layer 1404. Note that although no scattering/absorption structures are shown in FIG. 15G, in some embodiments they may still be present to correct for any non-uniformity in the reflected backward waves 1588 due to the way reflected backward waves 1588 are generated (or received) at the support structures 102 and 104. In some embodiments, the thickness of the airgap 1590 is not important, as long as no contact is made between substrate layer 1404 and mounting substrate 1582. The airgap 1590 may be created by edging the air cavity dimensions into the back of the substrate layer 1404, or the substrate layer 1404 may be mounted on the mounting substrate 1582 along the edges of the device layer 1402 using separate support structures 102 and 104. Intermediate support structures may also be added, depending on the stiffness of the mounting substrate 1582 and the dimensions of the airgap 1590. In some embodiments, airgap 1590 may be filled with any suitable material that improves the uniformity of the backscattered waves, for example, by creating an impedance mismatch with substrate 1404.

FIGS. 16A through 16D illustrate various examples of patterned backsides of a substrate layer, according to embodiments. In accordance with an embodiment of the teachings herein, the image sensing system, e.g., a human fingerprint sensor, includes substrate layer 1604 (e.g., substrate layer 1404) having front surface 1604b and back surface 1604a opposite the front surface. In some embodiments, the back surface 1604a is intentionally irregular so as to reduce any stray sound waves in the substrate layer.

As an example of a patterned or structured surface, the back surface 1604a comprises a plurality of regular or irregular indentations, such as trenches, 1614 therein, where trenches 1614 are three-dimensional structures. Other examples of regular or irregular indentations include scallops and saw-tooth configurations. By "regular" is meant that the indentations 1614 may be spaced the same distance apart (e.g., have the same pitch) and all have the same depth into the back surface 1604a. By "irregular" is meant that the indentations 1614 may be spaced different distances apart and/or have different depths into the back surface 1604a.

Figure 16A:
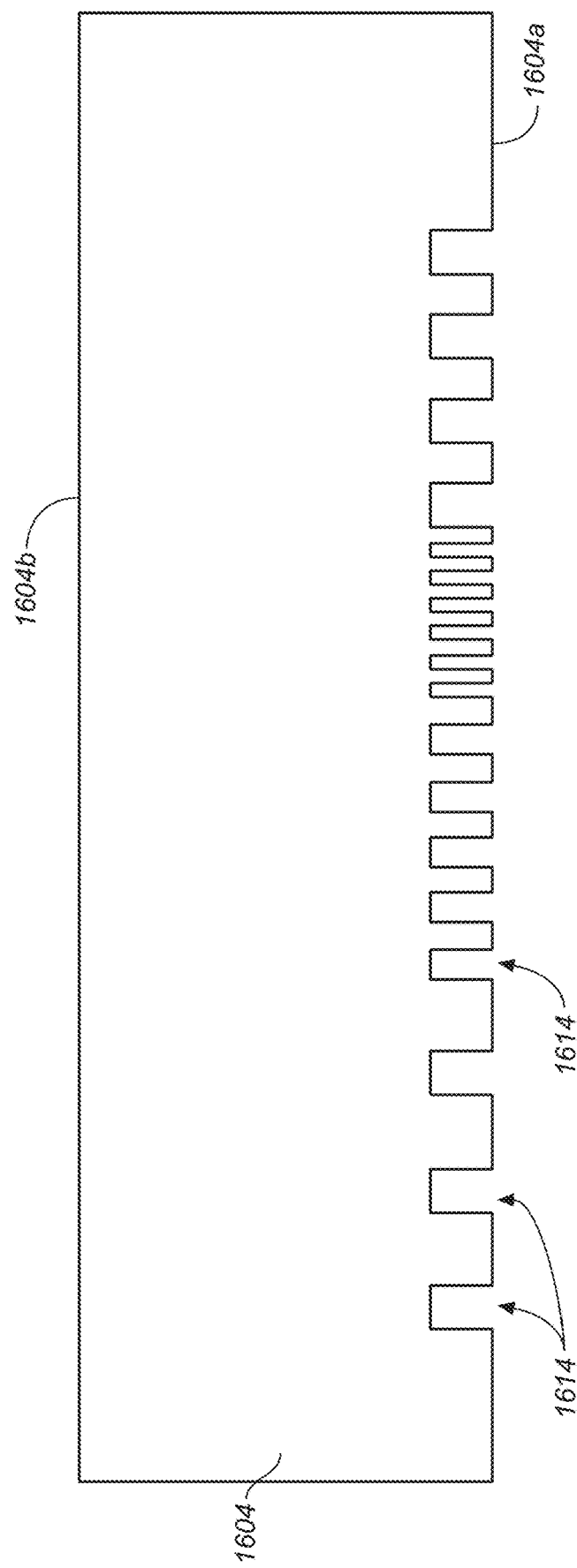
Figure 16C:
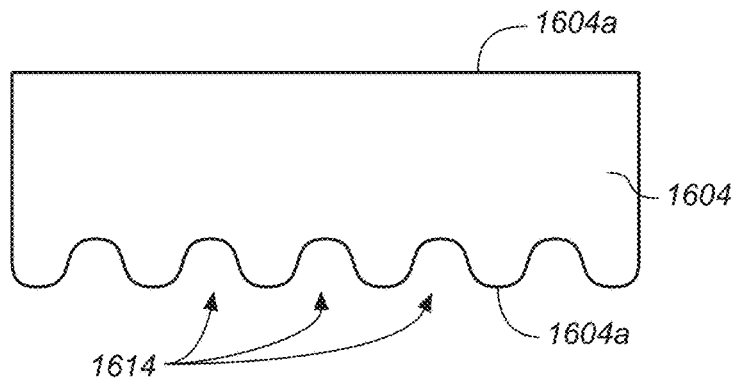
Figure 16D:
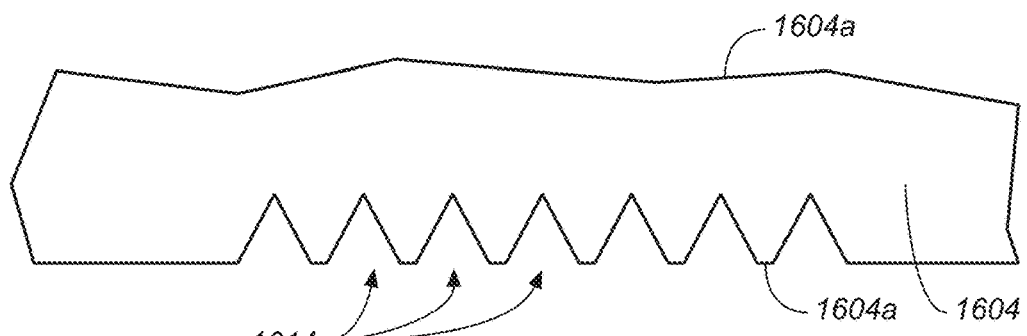

FIGS. 16A-16D depict further examples of a structured back surface 1604a. For example, trenches 1614 may be provided that are spaced apart by different distances (different pitches), as shown in FIG. 16A. The trenches 1614 may have different depths, as shown in FIG. 16B. In another configuration, the patterning may be provided by forming a series of arcs in the surface 1604a to form scalloped, or sinusoidal, indentations 1614, as shown in FIG. 16C. In yet another configuration, the patterning may be provided by forming a series of Vs in the surface 1604a to form a saw-toothed surface 1614, as shown in FIG. 16D. The saw-tooth may be symmetrical or asymmetrical, and may be continuous or intermittent with plat section in between the teeth. Further, combinations of such examples of patterning may be envisioned, such as trenches of different depths and different pitches. These are just a few examples that can be constructed. For example, patterning may be simply provided by etching (wet or dry etching) irregular pits into the surface 1604a.

In an embodiment, the trenches 1614 may be filled with a sound-absorbing material or a high loss material 1616. In some embodiments, the material is chosen so that there is no large acoustic mismatch with the substrate, since this would lead to reflection rather than transmission into the material.

The trenches 1614 can have a pitch (center-to-center spacing between adjacent trenches) and a depth/width that is adapted to a speed of sound or wavelength of the waves in the substrate layer 1604. For example, the pitch, depth and/or width may be a multiple or fraction of the wavelength.

In an embodiment, the trenches 1614 are configured in a two-dimensional array of indentations in the substrate layer 1604. Further, the two-dimensional array of holes may be aligned with the two-dimensional array of ultrasonic transducers 1602. Although the walls 1614a of the holes 1614 are shown vertical, they may, in an embodiment, be sloping inward to the bottom 1614b of the hole.

In some embodiments, the structures or indentations in the substrate are aligned with the transducers, at least in one dimension. The alignment enables a coordination between the support structures of the transducers and the indentations on the (backside of) the substrate. For example, the alignment makes sure the backward waves interact with the indentations as desired. In one embodiment, the support structures may direct the backward waves onto the indentation for optimal scattering. The indentation may be shape or angled for maximum scattering and minimizing entering the support structure after scattering, for example by maximum internal reflection in the substrate. In another embodiment, the alignment may enable an optimal use of the high-loss material for maximum absorption. In yet another embodiment, the alignment may be used with a combination of scattering and absorption. For example, the waves are scattered from the indentation and directed towards a high absorption material.

In the third class of embodiments, the operation of the transducers is adapted to maximize the forward waves, but minimize the backward waves. For example, the timing of the transmission of the different transducers may be adapted to create beamforming patterns. This comprises a time difference or phase difference between different transducers that works together to form a beam. In a similar manner, the time difference or phase difference may be used to minimize backward waves, for example by means of interference of the different waves of different transducers or support structures. In this case, each support structure can be seen as a source for generating backward waves, and the transducers are controller in a manner that these secondary sources generate interfering backward waves. In some embodiments, transducers can be operated at their resonant frequency where the displacement at the support structures is minimized. In some embodiments, the time delays between the individual transducer elements can be adjusted so as to defocus the backwards waves. In some embodiments, adapting the phase delay of the different transducers impacts the beam forming in the forward direction as well as in the backward direction. Therefore, a compromise may be needed so as to still achieve the desired beam forming in the forward direction for the imaging function, while at the same time reducing the backward waves through 'destructive' beamforming.

Figure 17:
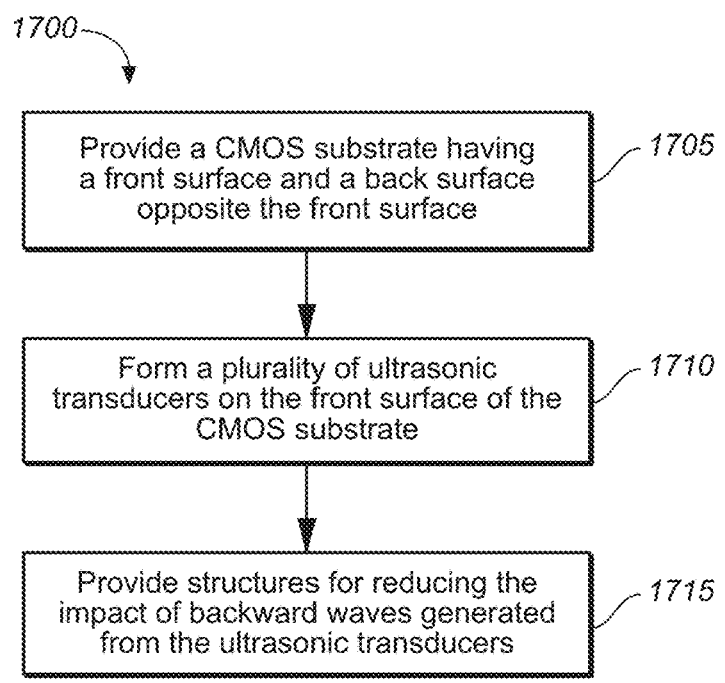
FIG. 17 is a flow chart, illustrating an embodiment of a method for reducing stray sound waves in an electronic device.

A method for reducing reflection of backward waves in an electronic device is also provided herein. The method 1700, which is illustrated in FIG. 17, comprises: providing 1705 substrate layer 1404 having front surface and back surface opposite the front surface. In one embodiment, the substrate layer 1404 is a CMOS substrate and includes CMOS control elements, an interconnection layer, and other ancillary elements to permit electrical communication between ultrasonic transducers and the CMOS control elements.

The method 1700 further comprises forming 1710 the plurality of ultrasonic transducers (e.g., PMUTs 100 or 100'), such as the two-dimensional array of PMUT devices, on the front surface of the substrate layer 1404.

Further in the method 1700, structures reducing the impact of backward waves generated from the ultrasonic transducers through the substrate layer 1404 are provided 1715. In one embodiment, the back surface 1604*a* of the substrate layer 1404 is patterned. As described above, in one embodiment, the back surface is patterned by forming a plurality of regular or irregular indentations, such as trenches, scallops, and/or saw-tooth configurations, therein. The filling of the indentations, their pitch and depth, their shape, and two-dimensional array configuration are all described above, as are the alignment of the two-dimensional array of holes with the two-dimensional array of ultrasonic devices, such as PMUT devices. In other embodiments, a mounting substrate (e.g., a PCB) including an acoustic absorption layer is provided for coupling to the substrate layer 1404. It should be appreciated that examples of structures for reducing backward waves are described above in accordance with FIGS. 15A-E and 16A-D.

After forming the substrate layer 1404 and ultrasonic transducers supported thereon, the substrate layer 1404 can be thinned to reduce the vertical height of the package. There are two ways to deal with the order of the formation of the indentations and thinning the substrate layer 1404. In a first example, thinning of the substrate layer 1404 is performed before forming the plurality of indentations. Because the substrate layer 1404 is thinned before the indentations are formed, the substrate layer 1404 may be fragile and difficult to handle. However, with suitable fixturing, this may not be a problem.

In a second example, thinning of the substrate layer 1404 is performed after forming the plurality of indentations. In this example, the indentations may be initially made deeper so that a final depth after thinning is a desired depth for a speed of sound in the substrate layer 1404. Although the substrate layer 1404 is more robust, since the trenches are formed first, this approach involves calculating the initial depth of the indentations and the extent of thinning to arrive at a pre-determined indentation depth for optimum sound absorption. However, this approach merely involves making calculations and controlling the thinning process.

Advantageously, the foregoing description of the solution to reducing backward waves in an electronic device, such as a sensor (e.g., a fingerprint sensor) does not increase package thickness (which would be the case if adding a sound-absorbing backing material to the back surface of the substrate layer 1404). The foregoing solution may further be improved by optimizing the support structure of the PMUT devices 100, 100' for minimal transmission of the sound waves into the substrate layer 1404.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems and components have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components. Any components described herein may also interact with one or more other components not specifically described herein.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Thus, the embodiments and examples set forth herein were presented in order to best explain various selected embodiments of the present invention and its particular application and to thereby enable those skilled in the art to make and use embodiments of the invention. However, those skilled in the art will recognize that the foregoing description and examples have been presented for the purposes of illustration and example only. The description as set forth is not intended to be exhaustive or to limit the embodiments of the invention to the precise form disclosed.

What is claimed is:

1. An electronic device comprising:
   a substrate layer having a front surface and a back surface opposite the front surface, the substrate layer comprising a plurality of control elements for controlling ultrasonic transducers and interconnections supporting electrical communication between the ultrasonic transducers and the plurality of control elements; and
   a plurality of ultrasonic transducers formed on the front surface of the substrate layer, wherein the plurality of ultrasonic transducers generate forward waves and backward waves during operation, the forward waves propagating away from the substrate layer for interaction with an object and the backward waves propagating into and through the substrate layer; and
   a plurality of substrate structures formed within the back surface of the substrate layer, the plurality of substrate structures configured to reduce an impact of the backward waves on a signal generated by reflected waves received responsive to the forward waves reflecting off of the object during the operation.

2. The electronic device of claim 1, wherein the plurality of substrate structures comprises scattering structures configured to modify a direction of the backward waves during the operation.

3. The electronic device of claim 2, wherein the scattering structures are dimensioned to create destructive interference of the backward waves.

4. The electronic device of claim 1, wherein the plurality of substrate structures comprises absorption structures comprising acoustic absorption material to modify an amplitude of the backward waves during the operation.

5. The electronic device of claim 1, wherein the plurality of ultrasonic transducers are Piezoelectric Micromachined Ultrasonic Transducer (PMUT) devices.

6. The electronic device of claim 5, wherein a PMUT device of the plurality of ultrasonic transducers comprises:
   a support structure connected to the substrate layer; and
   a membrane connected to the support structure such that a cavity is defined between the membrane and the substrate layer, the membrane configured to allow movement at ultrasonic frequencies, the membrane comprising:
   a piezoelectric layer,
   first and second electrodes coupled to opposing sides of the piezoelectric layer, and
   a mechanical support layer connected to the first electrode.

7. The electronic device of claim 6, wherein the support structure is one of an edge support structure and an interior support structure disposed within the cavity and connected to the substrate layer and the membrane.

8. The electronic device of claim 6, wherein the plurality of substrate structures are aligned with support structures of the plurality of ultrasonic transducers.

9. The electronic device of claim 6, wherein dimensions of the plurality of substrate structures are related to dimensions of support structures of the plurality of ultrasonic transducers.

10. The electronic device of claim 1, wherein dimensions of the plurality of substrate structures are related to operating characteristics of the plurality of ultrasonic transducers.

11. The electronic device of claim 1, further comprising a mounting substrate comprising a plurality of absorption structures, wherein the mounting substrate is coupled to the back surface of the substrate layer.

12. An electronic device comprising:
    a substrate layer having a front surface and a back surface opposite the front surface, the substrate layer comprising a plurality of control elements for controlling ultrasonic transducers and interconnections supporting electrical communication between the ultrasonic transducers and the plurality of control elements; and
    a plurality of ultrasonic transducers formed on the front surface of the substrate layer, the plurality of ultrasonic transducers comprising support structures coupled to the front surface of the substrate layer, wherein the plurality of ultrasonic transducers generate forward waves and backward waves during operation, the forward waves propagating away from the substrate layer for interaction with an object and the backward waves propagating from the support structures into and through the substrate layer, the support structures having a shape configured to minimize contribution of the backward waves on a signal generated by reflected waves received responsive to the forward waves reflecting off of the object during the operation.

13. The electronic device of claim 12, wherein the shape of the support structures is configured to control a direction of the backward waves.

14. The electronic device of claim 12, wherein the shape of the support structures is configured to control a stiffness of the support structures with respect to a stiffness of a membrane of an ultrasonic transducer of the plurality of ultrasonic transducers.

15. The electronic device of claim 12, wherein the support structures comprise edge support structures and interior support structures disposed within cavities of the plurality of ultrasonic transducers.

16. The electronic device of claim 12, further comprising:
    a plurality of substrate structures formed within the back surface of the substrate layer, the plurality of substrate structures configured to modify the backward waves during the operation.

17. The electronic device of claim 16, wherein the plurality of substrate structures comprises scattering structures configured to modify a direction of the backward waves during the operation.

18. The electronic device of claim 16, wherein the plurality of substrate structures comprises absorption structures comprising acoustic absorption material to modify an amplitude of the backward waves during the operation.

19. The electronic device of claim 12, further comprising a mounting substrate comprising a plurality of absorption structures, wherein the mounting substrate is coupled to the back surface of the substrate layer.

20. An electronic device comprising:
    a substrate layer having a front surface and a back surface opposite the front surface; and
    a plurality of ultrasonic transducers formed on the front surface of the substrate layer, wherein the plurality of ultrasonic transducers generate forward waves and backward waves during operation, the forward waves propagating away from the substrate layer for interaction with an object and the backward waves propagating into and through the substrate layer; and
    a mounting substrate comprising a plurality of absorption structures comprising acoustic absorption material to reduce an amplitude of the backward waves during the operation, wherein the mounting substrate is coupled to the back surface of the substrate layer.

21. The electronic device of claim 20, further comprising:
a second plurality of absorption structures formed within the back surface of the substrate layer, the second plurality of absorption structures comprising the acoustic absorption material to modify the amplitude of the backward waves during the operation.

22. The electronic device of claim 21, wherein the acoustic absorption material is configured to bond the substrate layer to the mounting substrate.

23. The electronic device of claim 21, wherein plurality of absorption structures are aligned with support structures of the second plurality of absorption structures.

24. The electronic device of claim 20, further comprising:
a plurality of spacers coupled to the back surface of the substrate layer and a surface of the mounting substrate, wherein the spacers define an airgap between the substrate layer and the mounting substrate, the airgap to modify amplitude of the backward waves during operation.

* * * * *